(12) United States Patent
Kim et al.

(10) Patent No.: US 12,706,160 B2
(45) Date of Patent: Aug. 11, 2026

(54) STAGGERED TRIGGERING CONTROLLER

(71) Applicant: ANAFLASH INC., Sunnyvale, CA (US)

(72) Inventors: Sihwan Kim, San Francisco, CA (US); Seung-Hwan Song, Palo Alto, CA (US); Jongseuk Lee, San Jose, CA (US)

(73) Assignee: ANAFLASH INC., Sunnyvale, CA (US)

( * ) Notice: Subject to any disclaimer, the term of this patent is extended or adjusted under 35 U.S.C. 154(b) by 175 days.

(21) Appl. No.: 18/395,713

(22) Filed: Dec. 25, 2023

(65) Prior Publication Data

US 2024/0221845 A1 Jul. 4, 2024

Related U.S. Application Data

(60) Provisional application No. 63/477,449, filed on Dec. 28, 2022.

(51) Int. Cl.

| | |
|---|---|
| *G11C 16/32* | (2006.01) |
| *G11C 16/04* | (2006.01) |
| *G11C 16/08* | (2006.01) |
| *G11C 16/24* | (2006.01) |
| *G11C 16/26* | (2006.01) |
| *G11C 16/30* | (2006.01) |

(52) U.S. Cl.
CPC ............ *G11C 16/32* (2013.01); *G11C 16/045* (2013.01); *G11C 16/08* (2013.01); *G11C 16/24* (2013.01); *G11C 16/26* (2013.01); *G11C 16/30* (2013.01)

(58) Field of Classification Search
CPC ....... G11C 16/32; G11C 16/045; G11C 16/08; G11C 16/24; G11C 16/26; G11C 16/30
USPC ........................................................ 365/185.1
See application file for complete search history.

(56) References Cited

U.S. PATENT DOCUMENTS

2003/0174573 A1* 9/2003 Suzuki .................... G11C 7/18 365/207
2019/0311749 A1* 10/2019 Song ...................... G11C 5/145

* cited by examiner

*Primary Examiner* — Alexander Sofocleous
*Assistant Examiner* — Duy H Luong

(57) ABSTRACT

A non-volatile memory device comprises an array of non-volatile memory cells, a controller in communication with the non-volatile memory cell, a row driver including a plurality of high-voltage switches for applying high-voltages to non-volatile memory cells, a column driver including a plurality of sensing circuits for monitoring the data of the non-volatile memory cells; and, a plurality of time delay circuits, wherein the time delay circuit is configured to reduce peak current caused by simultaneous application of high voltages to the non-volatile memory cells or simultaneous detection of current flowing across bit lines of the non-volatile memory cells.

13 Claims, 20 Drawing Sheets

STAGGERED TRIGGERING CONTROLLER

CROSS-REFERENCE TO RELATED APPLICATION

This application is based on and claims the benefit of U.S. Provisional Application Ser. No. 63/477,449, filed on Dec. 28, 2022, entitled Staggered Triggering Controller, to which a claim of priority is hereby made and the disclosure of which is incorporated by reference.

TECHNICAL FIELD OF THE INVENTION

This invention generally relates to a non-volatile memory and, more particularly, to a reliable and high speed operation of a memory device.

BACKGROUND OF THE INVENTION

The present invention relates to a non-volatile memory device that operates at high speeds and is controlled reliably. In order to ensure the quickest operation time and the highest performance of the memory device, programming, writing, and reading operations must all take place simultaneously. As a result, the memory device may not be able to handle peak current levels, resulting in the failure of the memory cell array in this case.

FIG. 1 shows a schematic diagram of a traditional non-volatile memory device. As depicted, a memory device 100 includes a non-volatile memory cell array 150; a row driver 130 for selecting a row of non-volatile memory cells in the memory cell array; a column driver 190 for selecting a column of non-volatile memory cells in the memory cell array; a controller 170 for activating or deactivating the row driver 130 and column driver 190; and a charge pump 110 for generating high voltages to erase, write/program the memory cell array.

In the memory device 100, when a high voltage HV is applied simultaneously to a plurality of memory cells in the memory cell array 150, excessive current flow at once (instantaneously) in the memory device 100 could cause the HV voltage to drop instantly and increase the chance of the memory device 100 malfunctioning. Additionally, when a plurality of sensing circuits (not shown) within the column driver 190 are operated simultaneously, excessive currents may flow in the memory device 100. Consequently, such excessive currents may increase the probability of an error in sensing (e.g., reading or verifying) the non-volatile memory cells in the memory cell array 150. However, if HV is applied to each memory cell separately and sequentially, it will take too much time to drive all of them, and if the BL detection circuit (not shown) in the column driver 190 is also driven one by one, it will take too much time.

Therefore, it is necessary to drive a plurality of memory cells or BL detection circuits allowing enough current to flow in the memory device 100 without errors, and the present invention is for this purpose. The purpose of the present invention is to reduce peak current due to high voltages applied simultaneously to a plurality of non-volatile memory cells and due to the simultaneous detection of current flowing through numerous BLs. With this invention, a staggered trigger method and control circuit are described that are designed to provide high performance and reliability.

In one embodiment according to the present invention, a non-volatile memory device comprises: an array of non-volatile memory cells; a controller in communication with the non-volatile memory cell; a row driver including a plurality of high-voltage switches for applying high-voltages to non-volatile memory cells; a column driver including a plurality of sensing circuits for monitoring the data of the non-volatile memory cells; and, a plurality of time delay circuits, wherein the time delay circuit is configured to reduce peak current caused by simultaneous application of high voltages to the non-volatile memory cells or simultaneous detection of current flowing across bit lines of the non-volatile memory cells.

In one embodiment, the non-volatile memory device further includes a charge pump circuit for pumping up a plurality of voltages from a predefined reference voltage, said charge pump circuit connected to the plurality of high voltage switches and the controller.

In one embodiment, the high voltage switch transmits an input signal to the non-volatile memory cell when activated by the controller, wherein said input signal can vary from a reference voltage predefined, two times the reference voltage, three times the reference voltage, and four times the reference voltage to the non-volatile memory cell.

In one embodiment, the sensing circuit comprises a pair of cross connected CMOS inverters in that an output node of a first CMOS inverter is coupled to an input node of a second CMOS inverter, wherein a PMOS circuit within the first CMOS inverter is connected to a first enable PMOS circuit in parallel and a PMOS circuit within the second CMOS inverter is connected to a second enable PMOS circuit in parallel; wherein (1) a NMOS circuit within the first CMOS inverter is connected to a first input NMOS circuit in series, a gate terminal of said first input NMOS circuit is connected to bit line and (2) a NMOS circuit within the second CMOS inverter is connected to a second input NMOS circuit in series, a gate terminal of said second input NMOS circuit is connected to a voltage reference line; and, wherein the first and the second NMOS circuits are connected to a third NMOS circuit, a drain terminal of the third NMOS circuit is shared by the first and second input NMOS circuits.

In one embodiment, an enable line connecting the controller and the sensing circuit is configured to connect gate terminals of the first and second enable PMOS circuits and a gate terminal of the third NMOS circuit.

In one embodiment, the row driver includes the time delay circuits connected in series, each time delay circuit arranged between all or some of the pairs of HV switches.

In one embodiment, the row driver includes the time delay circuits connected in series, each said time delay circuits arranged between all or some of groups including a plurality of the HV switches.

In one embodiment, the controller includes: a plurality of enable lines coupling the controller to each group with a plurality of the HV switches within the row driver, and a plurality of time delay circuits connected in series with an identical delay value arranged between each of the enable lines such that a plurality of enable signals are sequentially sent to the groups of HV switches coupled through the enable lines, respectively.

In one embodiment, the controller includes: a plurality of enable lines coupling the controller to each group with a plurality of the HV switches within the row driver, and a plurality of time delay circuits connected in parallel with different delay values arranged on each of the enable lines such that a plurality of enable signals are sequentially sent to the groups of HV switches coupled through the enable lines, respectively.

In one embodiment, wherein the column driver includes the time delay circuits connected in series, each said time delay circuit arranged between each pair of the sensing circuits.

In one embodiment, the delay circuits within the column driver are connected in series, each said delay circuits arranged between each group including a plurality of the sensing circuits.

In one embodiment, the controller includes: a plurality of enable lines coupling the controller to each group with a plurality of the sensing circuits within the column driver, and a plurality of time delay circuits connected in series with an identical delay value arranged between each of said enable lines such that a plurality of enable signals are sequentially sent to the groups of HV switches coupled through the enable lines, respectively.

In one embodiment, the time delay circuit is configured with a plurality of pairs of inverters connected in series.

In one embodiment, the time delay circuit is configured with (1) two input terminals, one of which receives an original enable input signal and the other of which receives a clock signal, and (2) an output terminal for generating an output signal which is the input signal delayed by predetermined numbers of clock signals.

In one embodiment, the time delay circuit is configured with two CMOS inverters connected in series, wherein (1) a first paired CMOS inverter of the pair has a common gate node for receiving an enable signal, and (2) a second paired CMOS inverter is connected in series to a reference transistor, which determines how long the input signal needs to be delayed and outputs the delayed enable signal upon receiving a gate signal.

In one embodiment, the time delay circuit includes two CMOS inverters connected in series, wherein (1) a first paired CMOS inverter of the pair has a common gate node for receiving an enable signal and (2) a second paired CMOS inverter is connected in series to a PMOS transistor, a drain terminal of said PMOS transistor coupled to a source terminal of a PMOS transistor of the second paired CMOS inverter.

In one embodiment, the time delay circuit includes two CMOS inverters connected in series, wherein (1) a first paired CMOS inverter of the pair has a common gate node for receiving an enable signal and (2) a second paired CMOS inverter is connected in series to a NMOS transistor, a drain terminal of said NMOS transistor coupled to a source terminal of a NMOS transistor of the second paired CMOS inverter.

In one embodiment, the non-volatile memory cell includes: a pair of PMOS transistors configured to share a floating gate; a stack of three NMOS transistors, a middle of said NMOS transistor has a gate extended to the floating gate; a plurality of word lines connected to the pair of PMOS transistors for program, write, or erase data stored in the floating gate; a pair of lines for enabling activation of the NMOS transistors; a bit line connected to one end of the stack of three NMOS transistors; and a sensing line connected to the other end of the stack of three NMOS transistors for sensing currents flow via a bit line.

In one embodiment, the high voltage switch is connected to a charge pump circuit, said high voltage circuit is configured to transmit an input signal to the connected non-volatile memory cell, transmit a reference voltage, two times the reference voltage, three times the reference voltage, and four times the reference voltage to the non-volatile memory cell when activated by the controller.

FIG. 2 shows a traditional row driver in the non-volatile memory device in FIG. 1. All high voltage HV switches with the same technical characteristics are numbered 250. All parallel high voltage HV switches 250 in a row driver 230 embedded in a non-volatile memory device 200 are connected to a memory cell array 150 and a controller 210. Each word line WL 270 connects a row of non-volatile memory cells (not shown) to each HV switch 250. An enable line EN 290 is extended from the controller 210 to all high voltage HV switches 250. The controller 210 activates or deactivates high voltage HV switch 250 with enabling signals on EN line 290. Since all high voltage switches share the common enabling line 290, the memory device 100 may experience excessive current flow if the plurality of HV switches simultaneously transmit high voltage to the corresponding memory cells through the corresponding word lines (WL1, WL2, through WL N) upon receiving an EN signal from the controller 210. This increases the likelihood of memory device errors occurring when writing, erasing, or operating the HV switch by applying excessive peak current immediately.

BRIEF DESCRIPTION OF THE DRAWINGS

The subject matter regarded as the invention is particularly pointed out and distinctly claimed in the concluding portion of the specification. It will be appreciated that for simplicity and clarity of illustration, elements shown in the figures have not necessarily been drawn to scale. Also, reference numerals may be repeated among the figures to indicate corresponding or analogous elements. The following drawing parts of the specification are included further to demonstrate certain embodiments or various aspects of the invention.

In some instances, embodiments of the invention can be best understood by referring to the accompanying drawings in combination with the detailed description presented herein. The description and accompanying drawings may highlight a certain specific example or a certain aspect of the invention. However, one skilled in the art will understand that portions of the example or aspect may be combined with other examples or aspects of the invention.

DETAILED DESCRIPTION OF THE INVENTION

In the following description, certain embodiments of the present invention will be described. For purposes of explanation, specific configurations and details are set forth in order to provide an understanding of the embodiments. However, it will also be apparent to one skilled in the art that the present invention may be practiced without the specific details. Furthermore, well-known features inherently a part of the invention and rudimentary to those having skill in the art are generally omitted or simplified in order not to obscure the embodiment being described. Further details of the present invention are described as follows with respect to the drawings.

Figure 1:
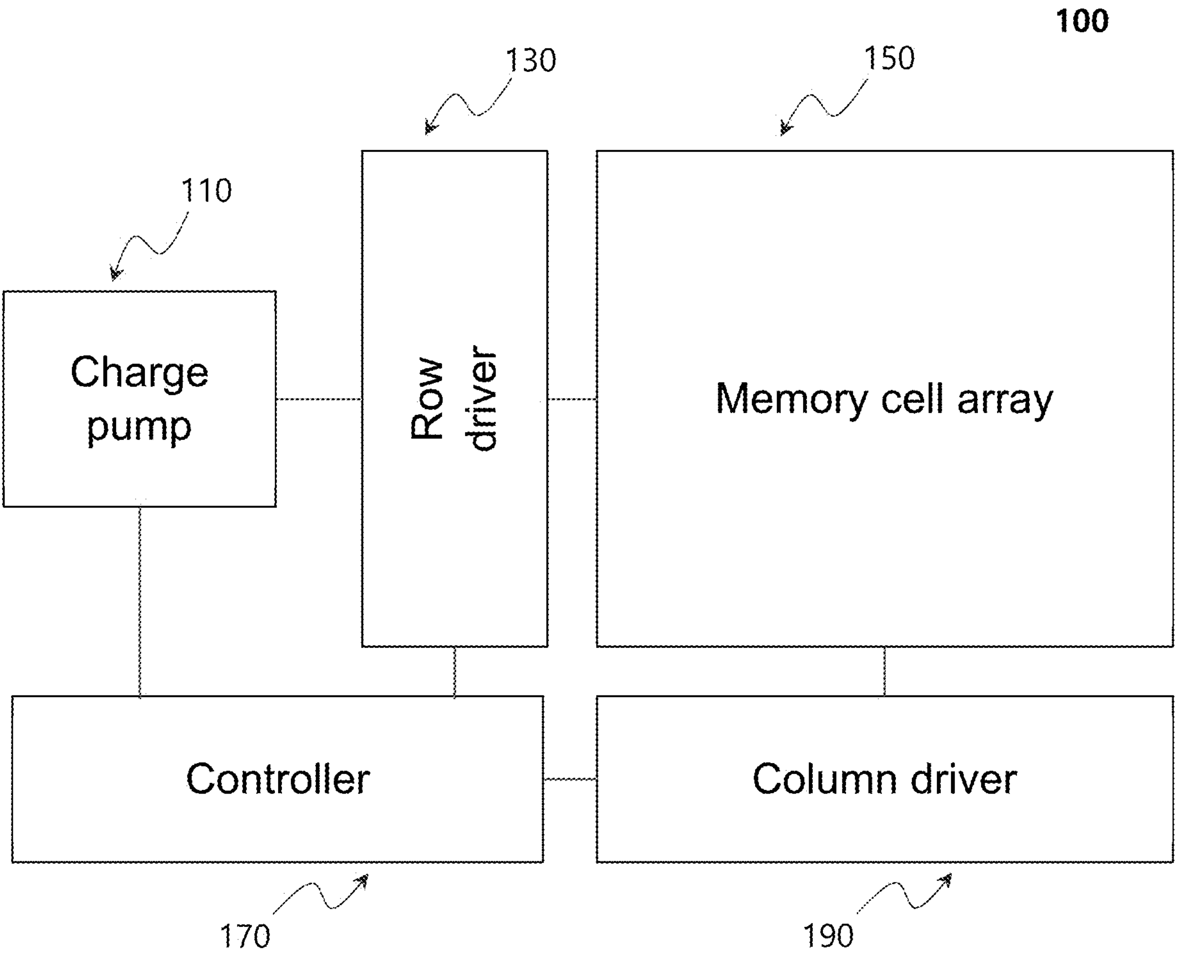
FIG. 1 shows a block diagram of a traditional non-volatile memory device.
Figure 2:
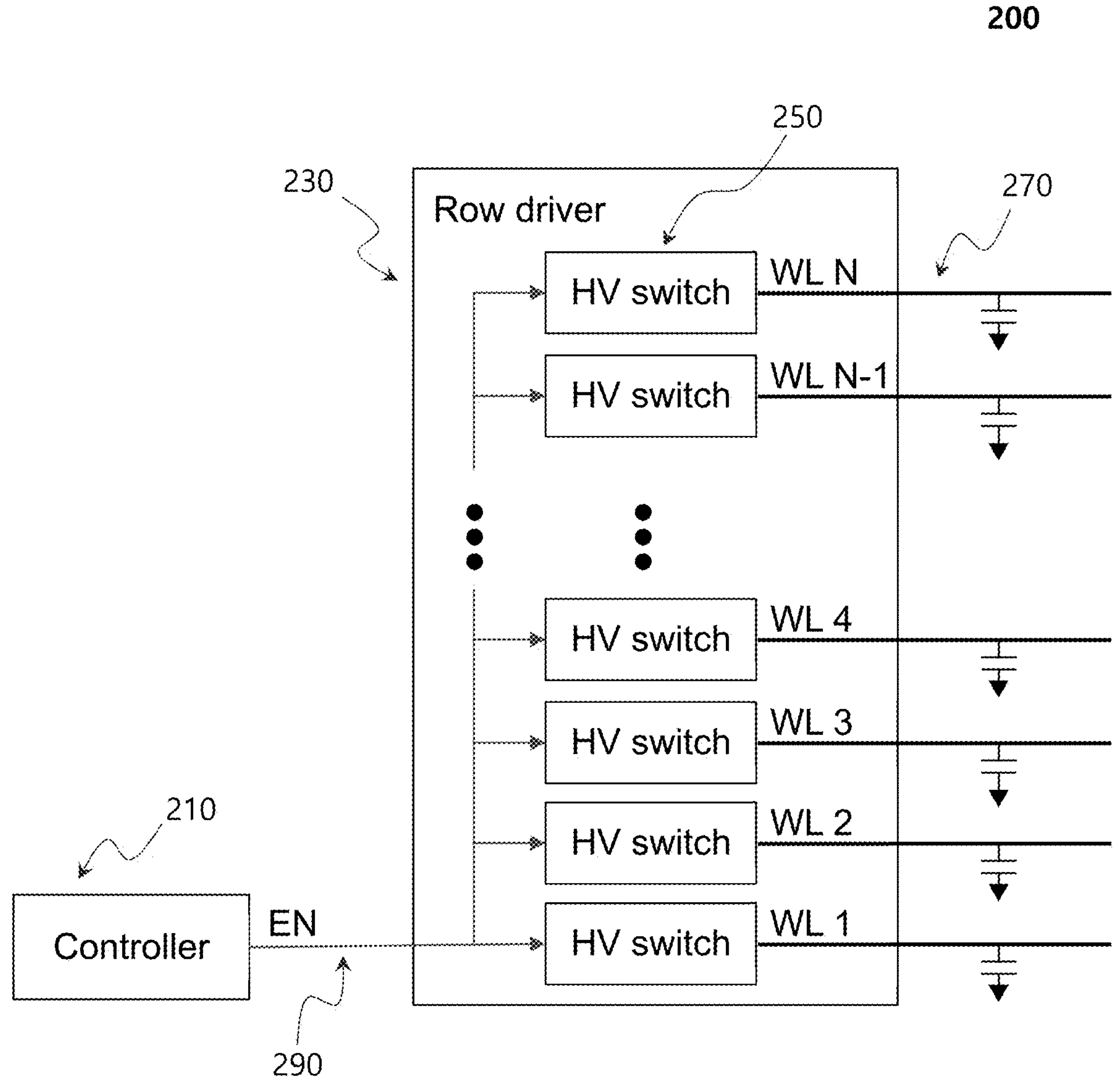
FIG. 2 shows a block diagram of a row driver in the traditional non-volatile memory device in FIG. 1
Figure 3:
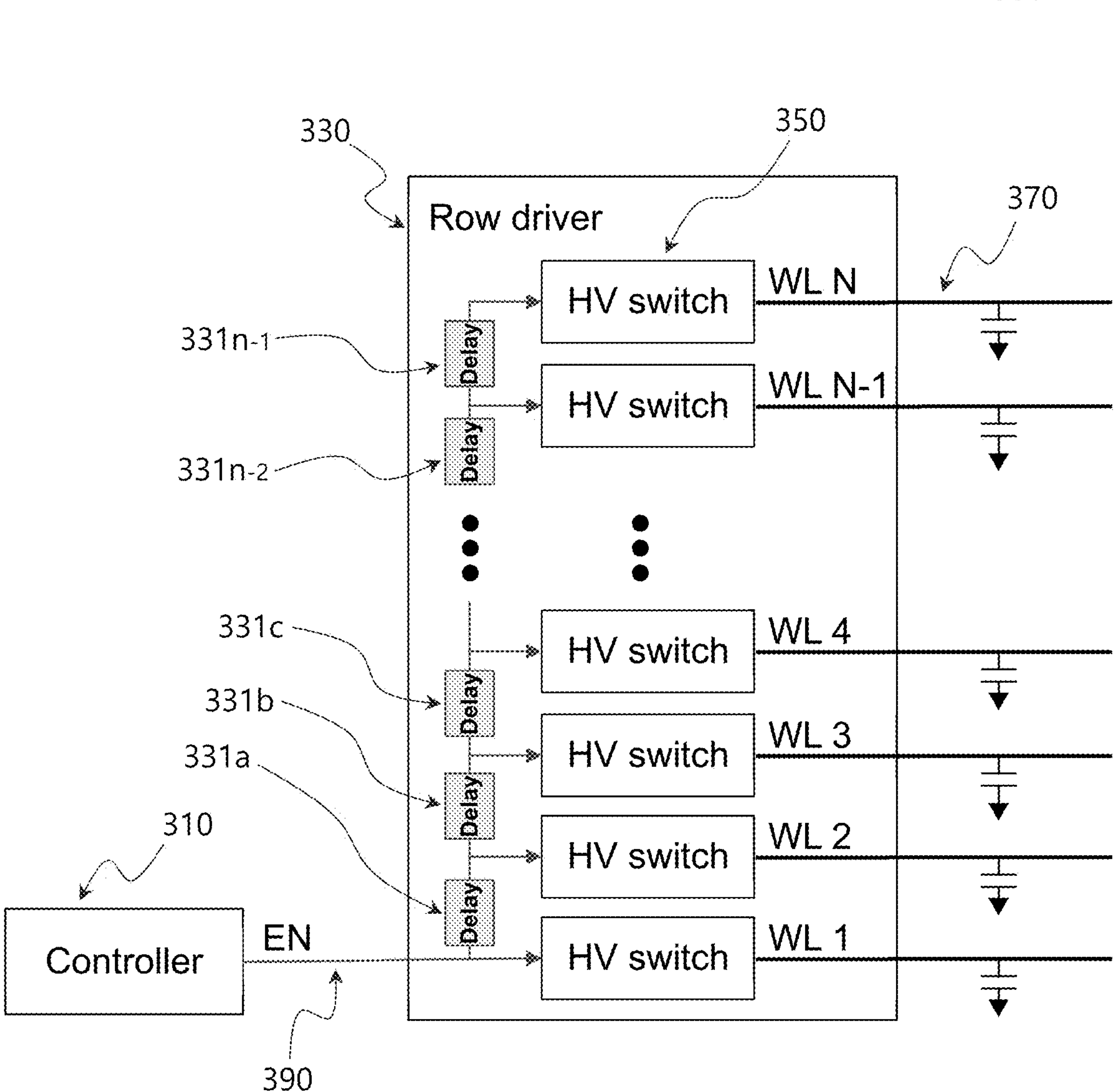
FIG. 3 is a block diagram of a row driver in a non-volatile memory device according to one embodiment of the present invention.

In FIG. 3, in a unit 300, a row driver 330 is equipped with a plurality of time delay circuits 331*a*, . . . , 331*n*−1, for generating subsequent enable signals with time intervals to the high voltage HV switches 350. In the diagram of a controller and the row driver 300 all HV switches with the same technical characteristics are numbered 350. As the time delay circuit 331*a*, . . . , 331*n*−1 is placed between the controller 310 and each HV switch 350 in the row driver 330. Each HV switch 350 receives an EN signal with a delay proportional to the number of the time delay circuits 331 arranged between the HV switch 350 and the controller 310. Specifically, the HV switch 350 connected to WL1 receives the EN signal 390 from the controller 310 without any delay. A time delay circuit 331*a* delays the EN signal 390 sent by the controller 310 to the HV switch connected to WL2. A time delay circuits 331*a* and 331*b* delay the EN signal 390 from the controller 310 to the HV switch connected to WL3. Three delay circuits 331*a*, 331*b*, and 331*c* delay the EN signal 390 from the controller 310 before it reaches the HV switch connected to WL4.

Therefore, despite sharing one EN signal line between the high voltage switches, the memory device 100 does not experience excessive current flow since the high voltage switches send high voltage with their own delay times to the memory cells through the corresponding word lines 370 (WL1, WL2, through WL N) upon receiving sequentially delayed EN signals. The arrangement of those time delay circuits 331*a*, 331*b*, . . . , 331*n*−1 prevents the likelihood of memory device errors as expected in the traditional row driver 230. Here, each of the time delay circuits is connected to every HV switch. However, in another embodiment of the present invention, only some of the entire HV circuits can be matched one-to-one by delay circuits. For instance, HV switches (with N numbers) can be connected in parallel with fewer numbers of time delay circuits (with N−1, N−2, N−3, N−4, . . . and so on). The number of the time delay circuits 331 can be determined by the user depending on their technical needs for reducing peak current due to high voltages applied simultaneously to a plurality of non-volatile memory cells. Also, the number of the time delay circuit may not be excessive resulting in the most remote HV switch 350 being triggered in time.

Figure 4:
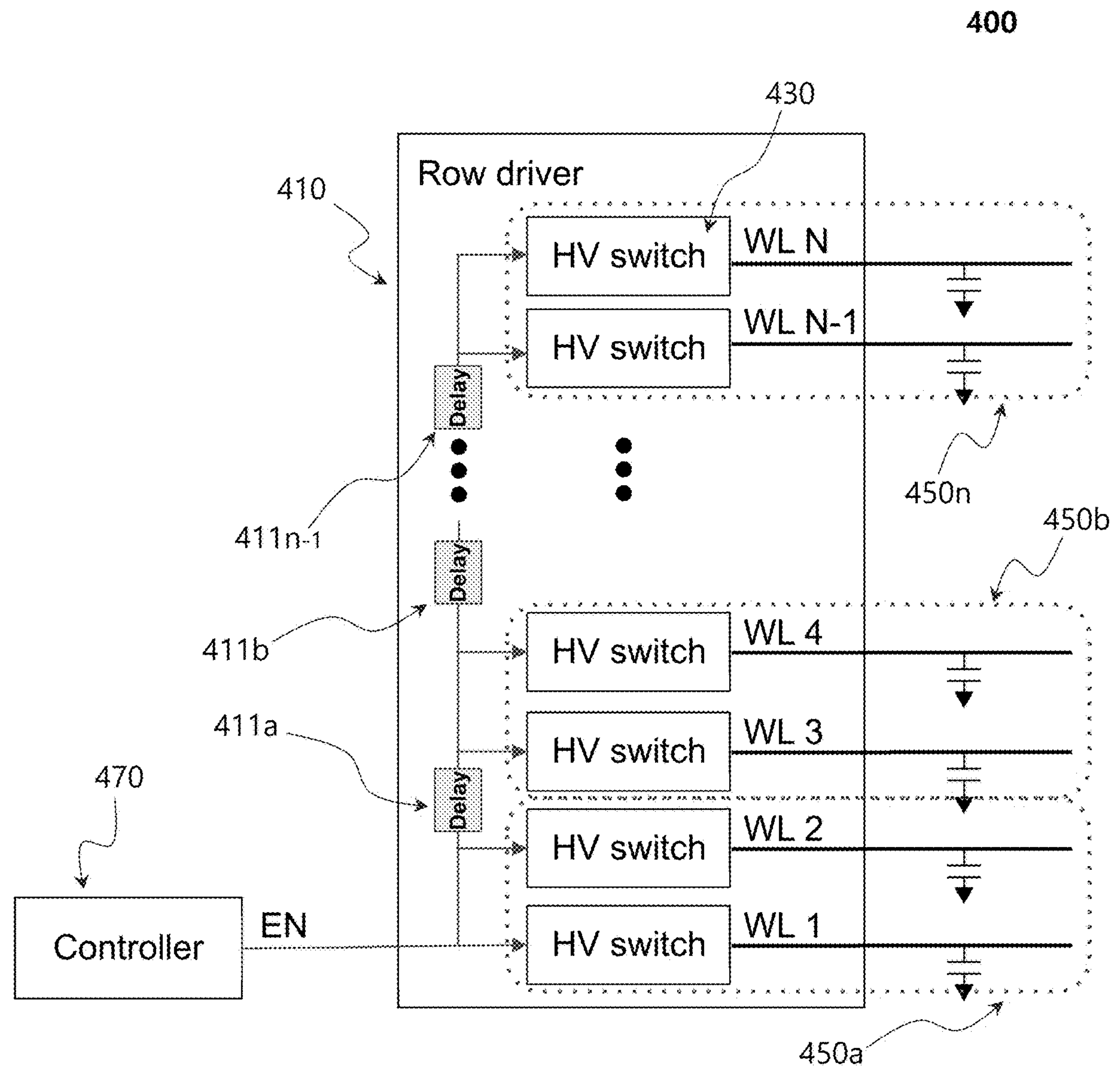
FIG. 4 is a block diagram of a row driver in a non-volatile memory device according to another embodiment of the present invention.

FIG. 4 illustrates one preferred embodiment of a row driver 410 according to the present invention. In a unit 400 embodied with a controller 470 and the row driver 410, all high-voltage HV switches with the same technical characteristics are numbered 430. The arrangement of the time delay circuits 411*a*, 411*b*, . . . , 411*n*−1 is to generate staggered triggering effects between a group of HV switches 430.

In the row driver 410, time delay circuits 411 are arranged per group of two HV switches 430. Due to this arrangement, two HV switches in a first group 450*a* receive the EN signal from the controller 470 without delay. A time delay circuit 411*a* delays the EN signal sent by the controller 470 to two HV switches in a second group 450*b*. The delay circuits 411*a* and 411*b* delay the EN signal from the controller 470 to the HV switch in a third group (not shown). As a result, two HV switches in a last group 450*n* receive the EN signal after being delayed by (n−1) delay circuits from the controller 470.

In another embodiment of the present invention, the time delay circuit may be arranged for each group containing more than two HV switches. By arranging the time delay circuits for each group of HV switches 450, the last HV switch group 450*n* will not experience significant delays, compared with arranging the time delay circuit per individual HV switch circuit. Also, despite sharing one EN signal line between the high voltage switches, the memory device 100 does not experience excessive current flow since the grouped high voltage switches send high voltage with their own delay times to the memory cells through the corresponding word lines (WL1, WL2, through WL N) upon receiving sequentially delayed EN signals.

Figure 5:
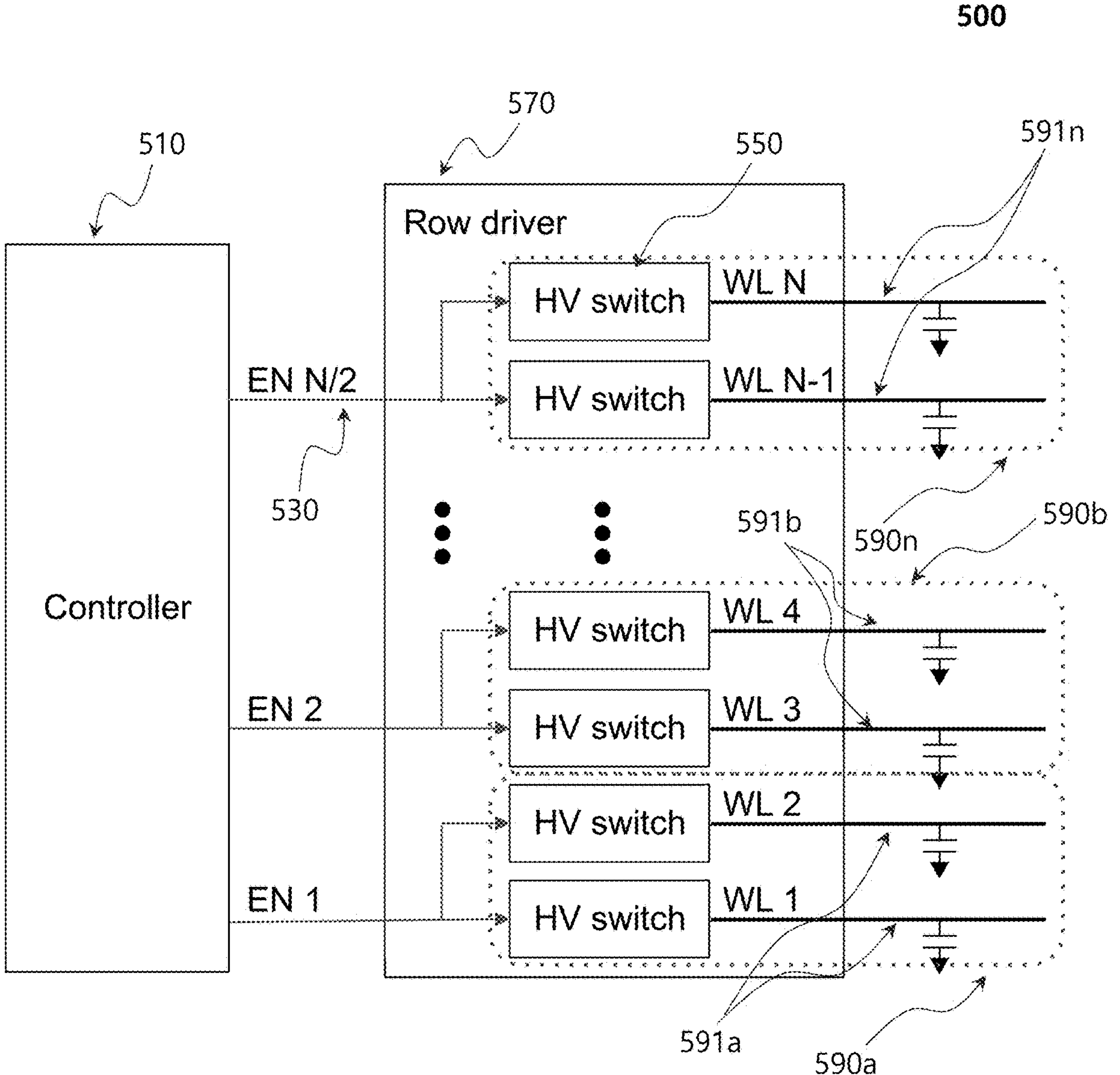
FIG. 5 is a block diagram of a combination of a controller and a row driver in a non-volatile memory device according to one embodiment of the present invention.

FIG. 5 shows a unit 500 embodied with a controller 510 and a row driver 570 in a non-volatile memory device according to one embodiment of the present invention. In FIG. 5, all HV switches in the row driver 570 with the same technical characteristics are numbered 550. All groups of these HV switches with the same amount are numbered 590.

The controller 510 is configured to transmit a plurality of delayed EN signals on EN1, EN2, . . . , EN N/2 lines 530. Each of these enabling signals has a predefined time interval. The controller 510 is also configured to determine a degree of delay between the original EN signals and transmit the delayed EN signals to groups of HW switches 550, respectively. HV switches 550 in each group 590*a*, 590*b*, . . . , 591*n* are coupled to pairs of WL lines 591 (WL 3 and 4, . . . , WL N−1 and N) and activated with a preset delay when receiving the delayed EN signals. The controller 510, for example, can transmit EN2 signal after transmitting the EN1 signal after T1 interval, the EN3 signal after transmitting the EN2 signal after the T1 interval, and the EN4 signal after transmitting the EN3 signal after T1 interval, and so on. In addition, the controller 510 can selectively perform sequential operations on groups of HV switches (590*a*, 590*b*, . . . , 590*n*). The controller 510, for example, may simultaneously send EN1 and EN2 signals to two groups of HV switches and EN3 to a third group before or after EN1 and EN2.

Figure 6:
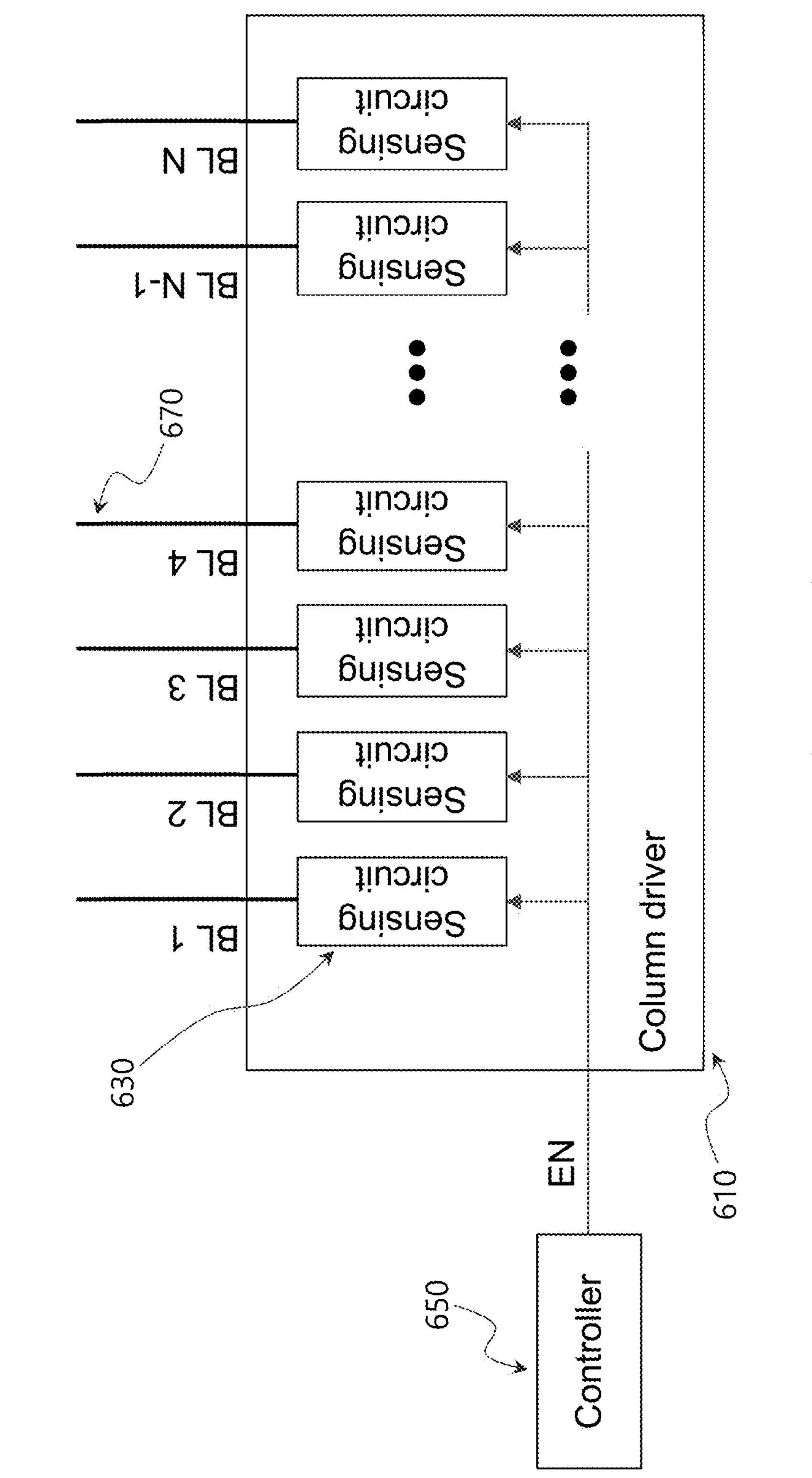
FIG. 6 is a block diagram of a column driver in the traditional non-volatile memory device in FIG. 1

FIG. 6 shows a column driver in a traditional non-volatile memory device. In a unit 600 embodied with a controller 650 and a column driver 610, all sensing circuits in the column driver 610 with the same technical characteristics are numbered 630. All sensing circuits 630 are connected to a controller 650 via the enable line EN, and to memory cells (not shown) via bit lines BL lines 670, namely BL1, BL2, BL3, BL4, . . . , BL N. Upon receiving an EN signal from the controller 650, all sensing circuits 630 are configured to activate simultaneously, so they measure currents on the BL1, BL2, BL3, BL4, . . . , BL N. It is necessary to consume a certain amount of current to perform sensing operations. Activating all sensing circuits 630 simultaneously may result in high peak currents, causing the memory device 100 to malfunction.

Figure 7:
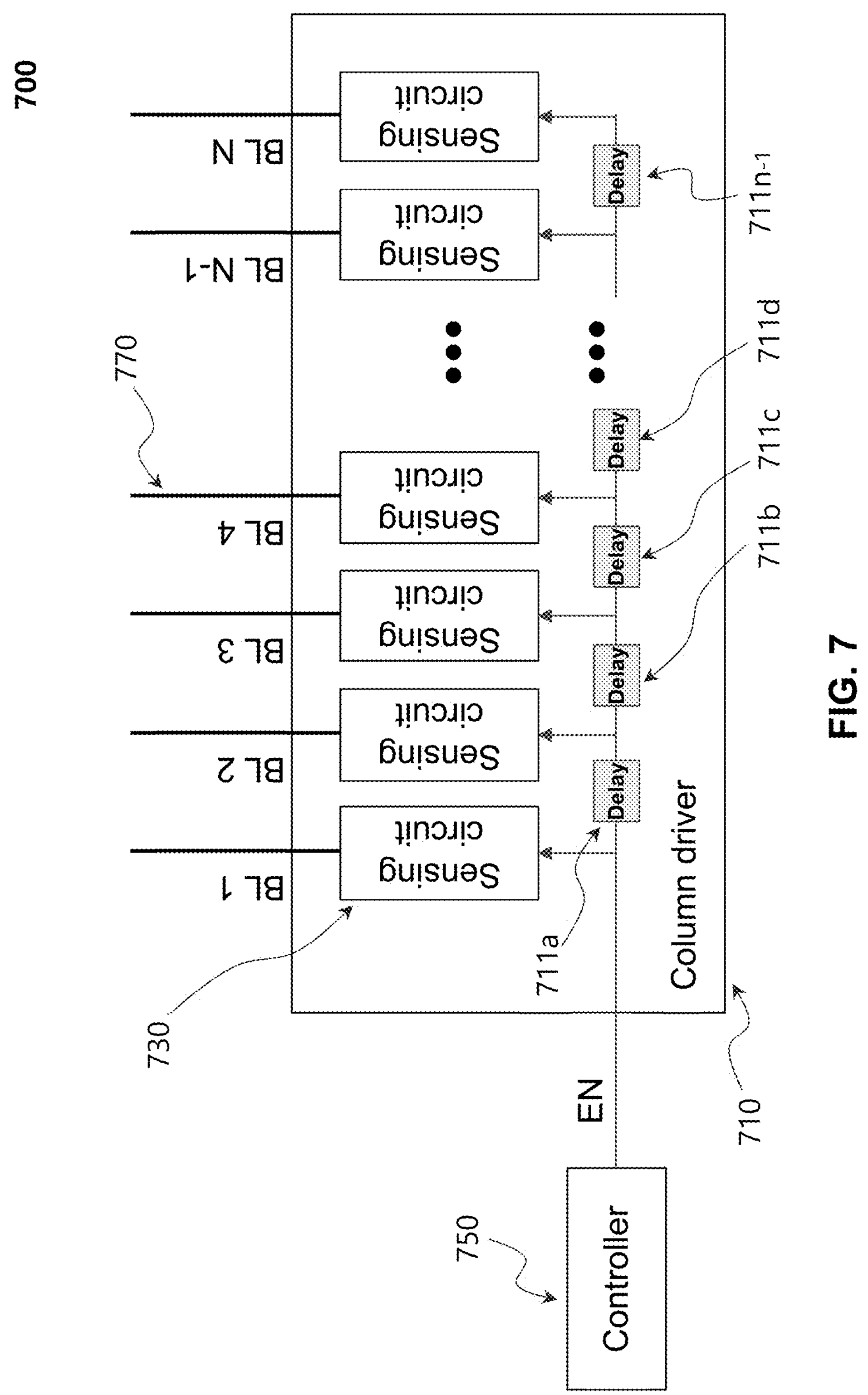
FIG. 7 is a block diagram of a column driver in a non-volatile memory device according to one embodiment of the present invention.

FIG. 7 shows a unit 700 embodied with a controller 750 and a column driver 710 configured with a plurality of time delay circuits according to one embodiment of the present invention. All sensing circuits in the column driver 710 with the same technical characteristics are numbered 730. Likewise, all time delay circuits with the same technical features are numbered 711.

In the column driver 710, a time delay circuit 711 is placed between the pair of sensing circuits 730. As a result, these sensing circuits 730 do not receive the EN signal simultaneously. Rather, each sensing circuit 730 receives an EN signal with a time delay proportional to the number of delay circuits 711 between the sensing circuit 730 and the controller 750. As an example, a sensing circuit 730 connected to BL1 receives the EN signal from the controller 750 without delay. A time delay circuit 711*a* delays the EN signal from the controller 750 to a sensing circuit connected to BL2. Two time delay circuits 711*a* and 711*b* delay the EN signal from the controller 750 to the sensing circuit connected to BL3. Subsequently, three time delay circuits delay the EN signal from the controller 750 to a sensing circuit connected to BL4 and so on. Lastly, n−1 number of sensing circuits delay the EN signal from the controller 750 to the last sensing circuit connected to BL N.

Therefore, despite sharing one EN signal line between the sensing circuits, the memory device 100 does not experience excessive current flow since the sensing circuits operate with their own delay times in sensing current flows on the corresponding bit lines 770 (BL1, BL2, through BL N) upon receiving sequentially delayed EN signals. The arrangement of those time delay circuits 711*a*, 711*b*, . . . , 711*n*-1 prevents the likelihood of memory device errors as expected in the traditional column driver 610. Here, each of the time delay circuits (711*a*, 711*b*, . . . , 711*n*−1) is connected to every sensing circuit. However, in another embodiment, only some of the entire sensing circuits can be matched one-to-one by the time delay circuits. For instance, sensing circuits (with N numbers) can be connected in parallel with fewer numbers of time delay circuits (with N−1, N−2, N−3, N−4, . . . and so on). The number of the time delay circuits 331 can be determined by the user depending on their technical needs of reducing peak current due to high voltages applied simultaneously to a plurality of non-volatile memory cells. In addition, the number of the time delay circuits may not be too high causing the remotely located sensing circuits to be active significantly later because of n−1 numbers of delay circuits.

Figure 8:
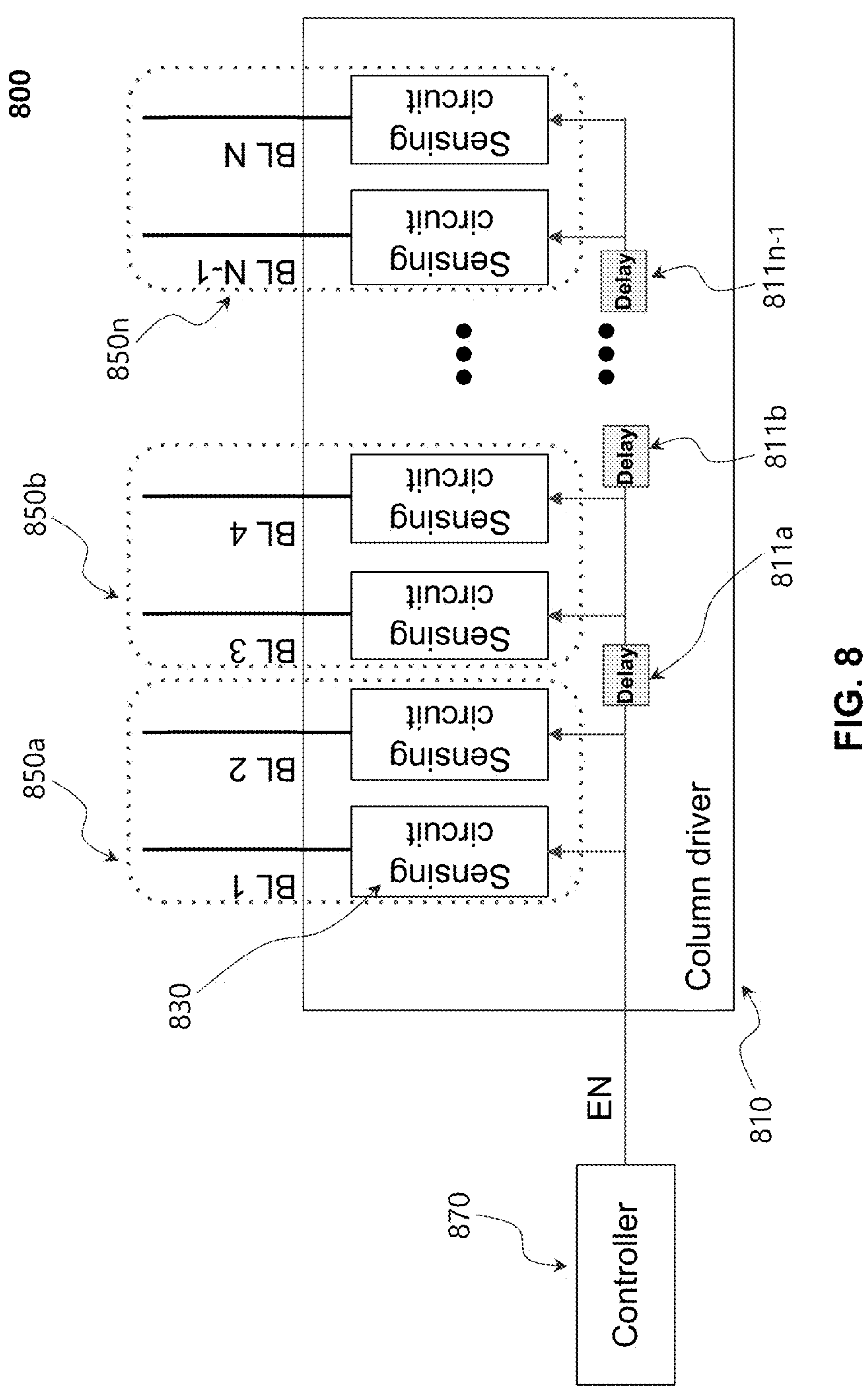
FIG. 8 is a block diagram of a column driver in a non-volatile memory device according to another embodiment of the present invention.

FIG. 8 shows a unit 800 embodied with a controller 870 and a column driver 810 with a plurality of time delay circuits according to one preferred embodiment of the present invention.

In the column driver 810, all sensing circuits with the same technical characteristics are numbered 830. All groups including two sensing circuits 830 are numbered 850. Also, these groups are listed as 850*a*, 850*b*, 850*c*, . . . , 850*n* according to their distance from the controller 870. All time delay circuits with the same technical features are numbered 811. As one embodiment of the present invention, each said time delay circuits are arranged between two sensing groups. The first time delay element 811*a* is placed between the first circuit group 850*a* and the second group 850*b*, and the second time delay element 811*b* is placed between the second group 850*b* and the third group 850*c*. Accordingly, the first group 850*a* receives an EN signal from the controller 870 without delay, and the second group receives the EN signal delayed for a specified time through the first delay circuit 811*a*. A delayed EN signal is transmitted to the third group through the first delay circuit 811*a* and the second delay circuit 811*b*.

In another embodiment of the present invention, the time delay circuit may be arranged for each group containing more than two sensing circuits. By arranging the time delay circuit for each group of sensing circuits 811*a*, 811*b*, . . . 811*n*−1 the last sensing circuits group 850*n* will not experience significant delays, compared with arranging the time delay circuit per individual sensing circuit. Also, despite sharing one EN signal line between the sensing circuits, the memory device 100 does not experience excessive current flow since the grouped sensing circuits accept BL currents with their own delay times from the memory cells (now shown) through the BL lines upon receiving sequentially delayed EN signals. This arrangement of delay circuits between the groups of sensing circuits is to prevent too much delay in activating the sensing circuit in the column driver by the time delay circuits, as shown in FIG. 7.

Figure 9:
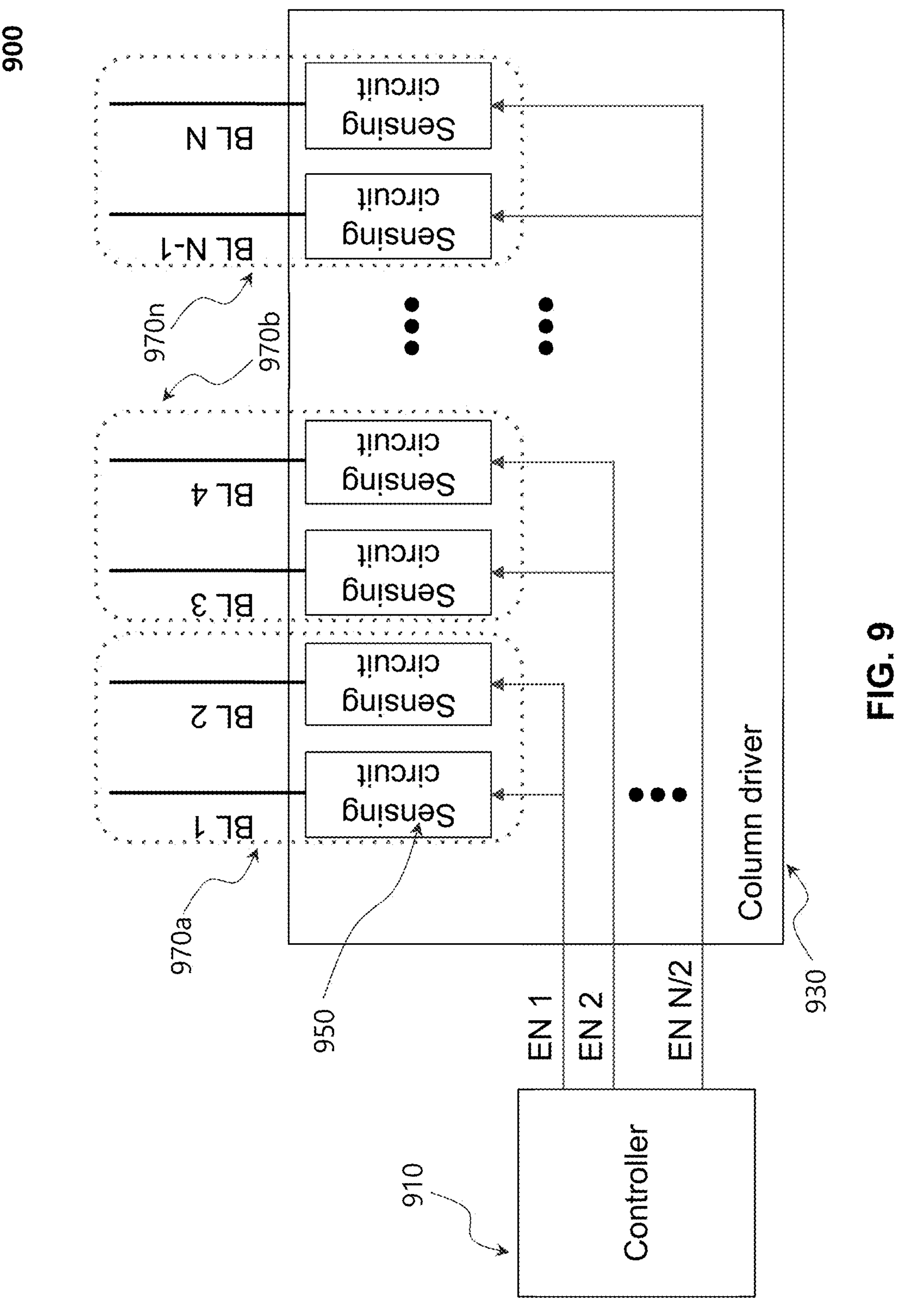
FIG. 9 is a block diagram of a combination of a controller and a column driver according to one embodiment of the present invention.

FIG. 9 shows a unit 900 embodied with a controller 910 and a column driver 930 wherein the controller 910 generates a plurality of delayed EN signals according to another embodiment of the present invention.

In the column driver 930, all sensing circuits with the same technical characteristics are numbered 950. All groups including two sensing circuits 950 are numbered 970. Also, these groups are listed 970*a*, 970*b*, 970*c*, . . . , 970*n* based on their distance from the controller 910. The sensing circuits in all groups are configured to detect currents on connected bit lines, respectively, upon receiving EN signals.

The controller 910 is configured to transmit a plurality of delayed EN signals on EN1, EN2, . . . , EN N/2 lines. Each of these enabling signals may have a predefined time interval. The controller 910 is configured to determine a degree of delay between the original EN signals and sequentially transmit the delayed EN signals to the sensing circuit groups 970*a*, 970*b*, 970*c*, . . . , 970*n*, respectively. The pair of sensing circuits 950 in the sensing group are coupled to a pair of bit lines (BL1/BL2, BL3/BL4, . . . , BL N−1/BL N) and activated with a preset delay when receiving the delayed EN signals.

The controller 910, for example, can transmit EN2 signal after transmitting the EN1 signal after T1 interval, the EN3 signal after transmitting the EN2 signal after the T1 interval, and the EN4 signal after transmitting the EN3 signal after T1 interval, and so on. In addition, the controller 910 can selectively perform sequential operations on the sensing circuit groups (970*a*, 970*b*, . . . , 970*n*). The controller 910, for example, may simultaneously send EN1 and EN2 signals to two sensing circuit groups 970*a*, 970*b* and EN3 to a third sending circuit group (not shown) before or after EN1 and EN2. The sensing circuits in all groups are configured to detect currents on connected bit lines, respectively, upon receiving EN signals.

Figure 10:
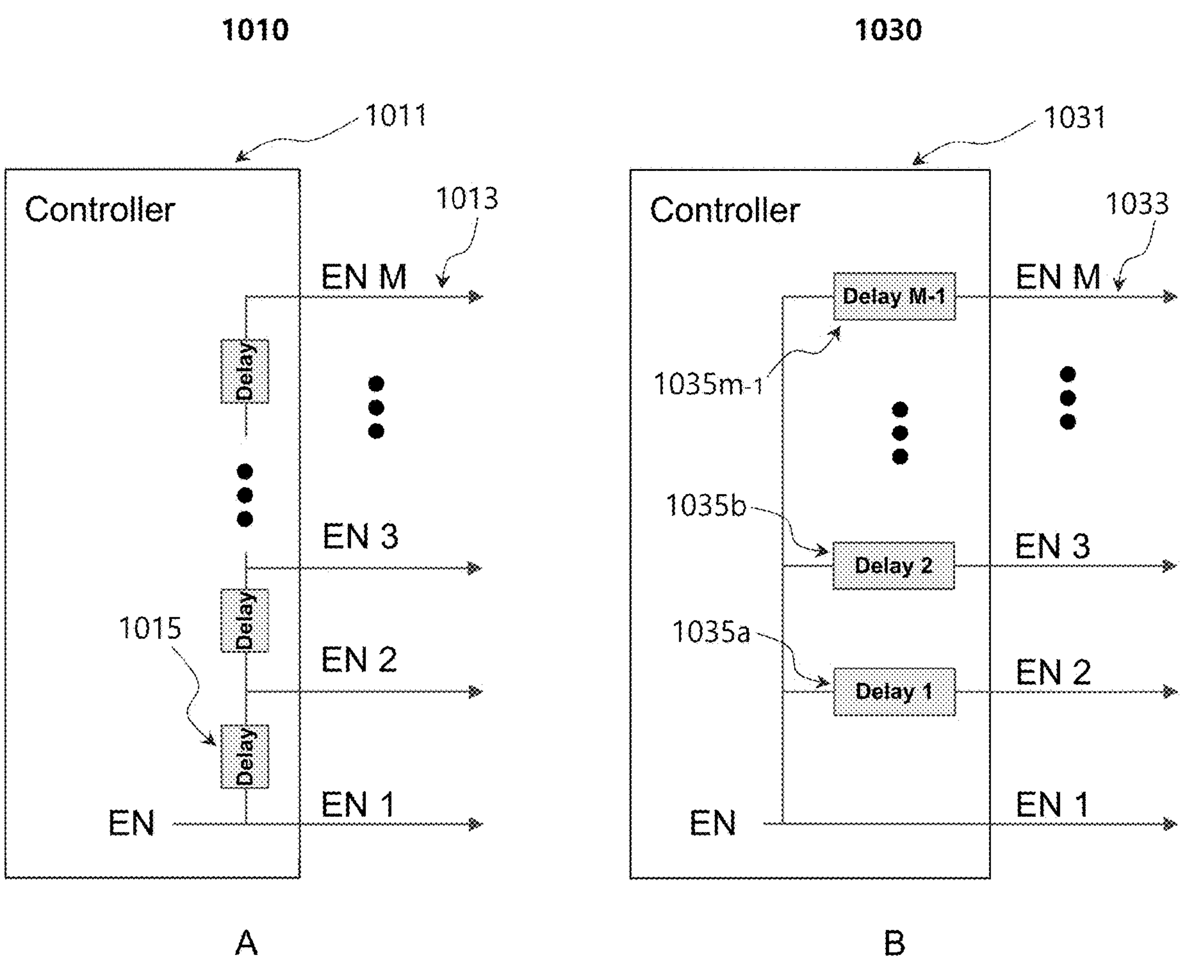
FIGS. 10A and 10B show block diagrams of the controller in FIG. 9 according to embodiments of the present invention.

FIGS. 10A and 10B illustrate controllers 1010 and 1030 embodied in the non-volatile memory device according to one embodiment of the present invention. The controllers in FIGS. 10A and 10B are configured to generate a plurality of delayed EN signals to sensing circuits or HV switches connected.

In FIG. 10A, all time delay circuits with the same technical characteristics are numbered 1015. A controller 1011 in the non-volatile memory device 100 may be equipped with a series of time delay circuits 1015 arranged between EN signal lines 1013 in order to generate subsequent enable signals with time intervals to (1) the plurality of high voltage switches in the row driver in FIG. 5 or (2) the plurality of sensing circuits in the column driver in FIG. 9 via connected enabling lines. In the controller 1011, (1) a delay circuit 1015 can be provided between all or some pairs of EN lines, or (2) two or more delay circuits 1015 can be provided between all or some pairs of EN lines according to embodiments of the present invention. Each of the time delay circuits 1015 can have the same delay value or a different delay value. Regardless of the variable time delay values, more time delay circuits will be passed through as enable lines EN increase, resulting in longer delays in delivering an enabling signal to sensing circuits or HV switches.

The arrangement of the time delay circuits 1015 can be determined by the user depending on their technical needs of reducing peak current due to high voltages applied simultaneously to a plurality of non-volatile memory cells. In addition, the number of the time delay circuits may not be too high causing the remotely located sensing circuits to be active significantly later because of m−1 numbers of delay circuits. During the operation of the controller 1011, EN signals are transmitted via enabling lines EN1, EN2, . . . , EN M (1013). The controller 1011, for instance, can transmit the EN signal without delay on the EN1. A first time delay circuit between EN1 and EN2 delays the EN signal on the EN2 line. Using first and second delay circuits between EN1 and EN3 lines, the EN signal on the EN3 line is delayed. Three time delay circuits (not shown) between EN1 and EN4 (not shown) lines delay the EN signal on the EN4 line (not shown). Finally, the time delay circuits between EN1 and EN M lines delay the EN signal on the EN M line. The high voltage switches in FIG. 5 or the sensing circuits in FIG. 9 connected to the controller 1011 may receive EN signals with a time delay proportional to the number of the time delay circuits arranged.

In FIG. 10B, a controller 1031 is configured with multiple time delay circuits 1035, wherein the time delay circuits all have different delay values. Specifically, the controller 1031 and each EN line 1033 are connected by one time delay circuit. In the controller, the EN signal passes through each time delay circuit, 1035*a*, 1035*b*, . . . and 1035*m*−1, and is delivered to each EN line, EN 1, EN 2, . . . , and EN M, with corresponding delay times, respectively. There may be different delay values in all or some of the time delay circuits in the controller 1031, causing all or some enabling signals to be transmitted through EN 1 through EN M at different times such that those delayed enabling signals for the high voltage switches in FIG. 5 or the sensing circuits in FIG. 9 can reduce peak current within a tolerable current in the memory device 100.

Figure 11A:
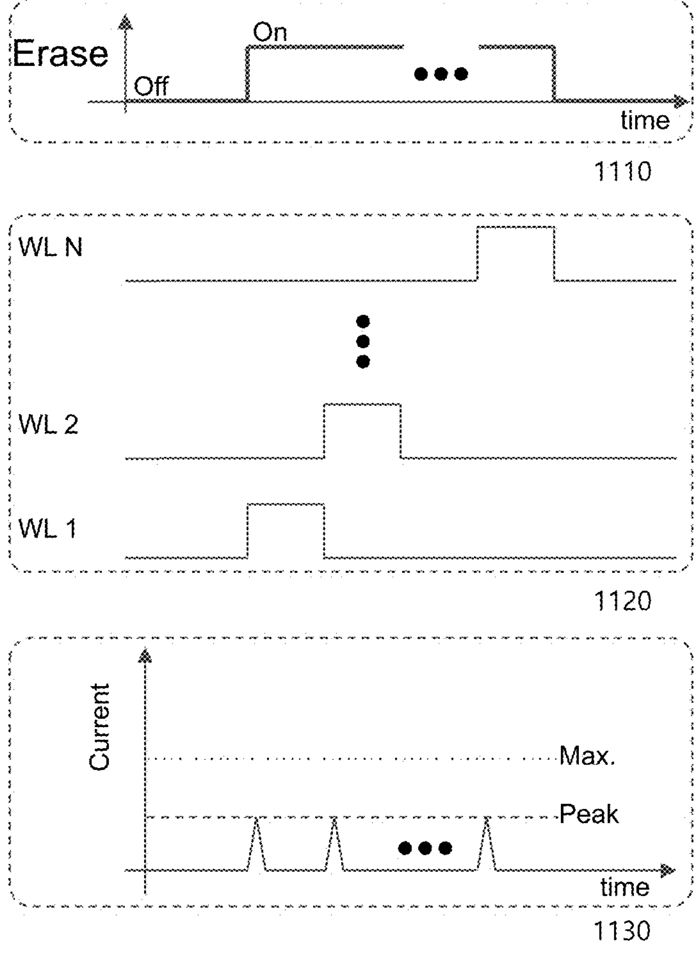
FIGS. 11A, 11B, and 11C show timing diagrams of word line signals for an erase operation of the non-volatile memory device in FIG. 1.
Figure 11B:
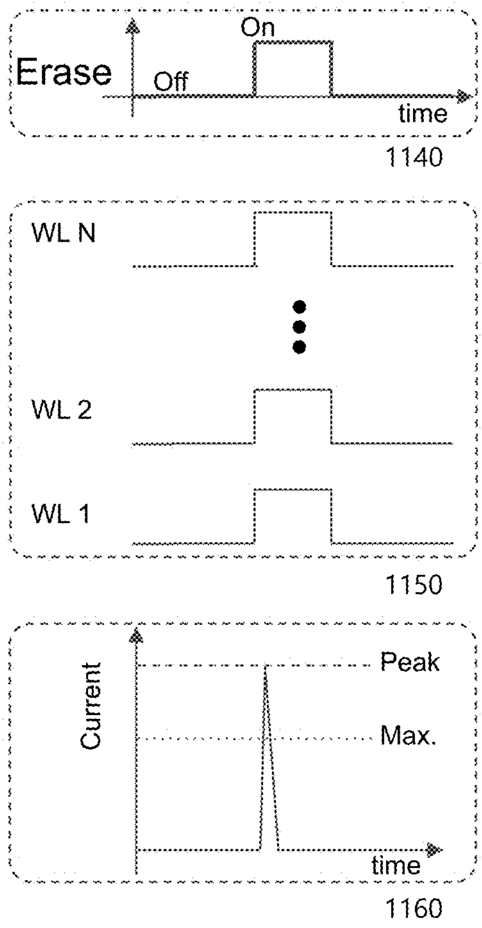
Figure 11C:
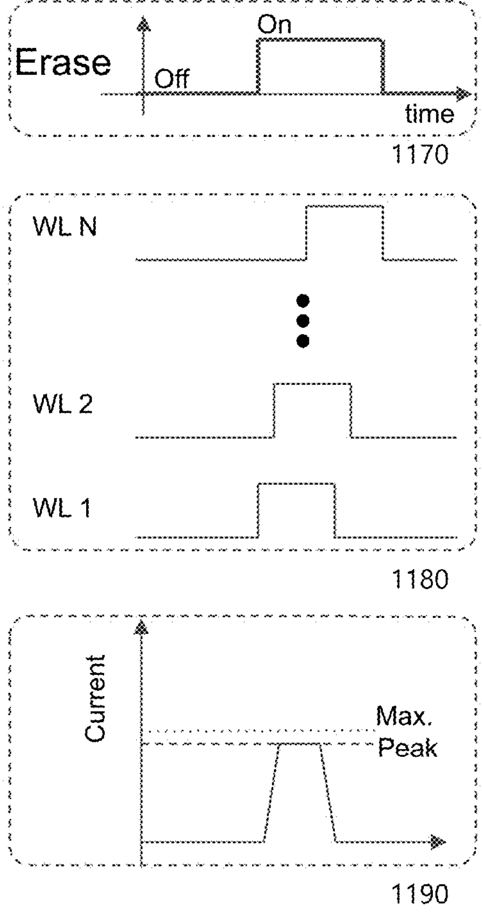

The timing diagrams in FIGS. 11A, 11B, and 11C shows exemplary operation time, WL pulses, and current of a non-volatile memory device for an erasing operation. For exemplary purposes, an erase operation of a non-volatile memory device is illustrated. However, a program/write operation can follow a similar pattern.

FIG. 11A shows exemplary erase operation time, WL pulses, and current of the non-volatile memory device within allowable limits while generating multiple sequential WL pulses with sufficient intervals and without overlapping.

A timing diagram 1110 shows the total erasing time of the memory cell array 150. By applying the erasing pulse through the corresponding word line to non-volatile memory cells, all selected non-volatile memory cells are erased. The total erasing time begins when the HV pulse of WL1 rises and ends when the HV pulse of the last WL (i.e., WL N, 1120) drops. Multiple timing diagrams 1120 show multiple WL pulses for corresponding memory cells, each having a different period. More specifically, WL pulses are generated successfully from different HV switches and disappear after a short time. When a WL 1 pulse disappears, a WL 2 pulse rises in succession. And when a WL 2 pulse disappears, a WL 3 pulse rises in succession. This sequential word line pulse pattern between HV switches in the controller continues to WL N, the last word line when each of the target memory cells is erased. For this purpose, HV switches in the row driver sequentially apply a given erasing pulse one after another to nonvolatile memory cells through corresponding word lines. The word line of the selected cell (WL 1) is raised to and remains at a given erasing high voltage during a preset time period. Consequently, the word line of a selected cell (WL 2) is then raised to the high voltage when WL1 is dropped to a low level (e.g., ground level); then, the word line of the next selected cell (WL N) is raised to the high voltage when WL N−1 is dropped to a ground level.

A timing diagram 1130 shows a characteristic distribution of total current when the non-volatile memory device is in an erase operation stage. When all high voltage HV switches sequentially supply erase voltage one after another, the memory device can control its peak applying current level within a target current level (max). However, it should be noted that the ERASE time (at the top, 1110) becomes very long. (Performance is poor due to lack of high-speed operation).

FIG. 11B shows exemplary operation time, WL pulses, and current of a non-volatile memory device where the current level is higher than the allowable value due to simultaneous WL pulses. A timing diagram 1140 shows a total erasing time for the case of simultaneous erase operation. In time diagrams 1150, the word line (WL 1, WL 2, . . . , WL N) are raised to a high voltage (e.g., 10-15 V) for certain period then lowered to a low voltage for erasing selected memory cells. A timing diagram 1160 shows the total current when the row driver applies the HV voltage simultaneously to the memory cells in the array. As a result, spike currents (e.g., excited peak values) exceed a tolerable current level (max). As a result of the peak current exceeding Max, the HV switch in the row driver may malfunction, causing the HV value to temporarily drop, resulting in an erase error.

FIG. 11C shows exemplary operation time, WL pulses, and current of a non-volatile memory device where the current level is below the allowable amount due to intended overlaps among WL pulses according to one embodiment of the present invention.

A timing diagram 1170 shows the total erasing time for overlapped WL pulses. It has a predefined time due to the overlap of all WL pulses applied to sensing circuits during this time. The total erasing time is longer than the total time in FIG. 11B, but shorter than that in FIG. 11A.

Multiple timing diagrams 1180 show the sequential application of erasing voltages by HV switches in the row driver. For instance, the first HV pulse for erasing voltage via the first word line (WL1), a second current pulse for erasing voltage via the second world line (WL2), and an Nth current pulse for erasing voltage via the Nth world line (WL N) overlap each other during the erasing operation.

A timing diagram 1190 illustrates a total current characteristic for a non-volatile memory device when overlapping WL pulses are applied to the selected memory cells. In this way, a spike current's magnitude (for example, its maximum value) does not exceed a tolerable level (max). Since HV is applied after a delay to each WL, the number of WLs to which HV is applied at any given moment is adjusted so that the peak current does not exceed the maximum. This can prevent errors in the erase operation, and the erase time can be greatly reduced compared to FIG. 11A.

Figure 12A:
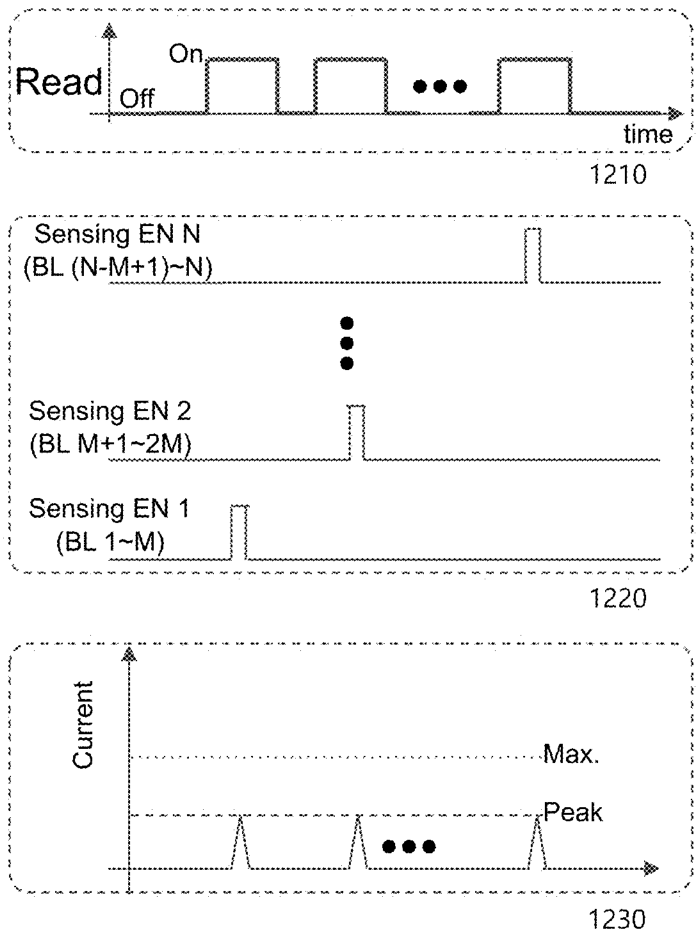
FIGS. 12A, 12B, and 12C show timing diagrams of bit line signals for a read operation of the non-volatile memory device in FIG. 1.
Figure 12B:
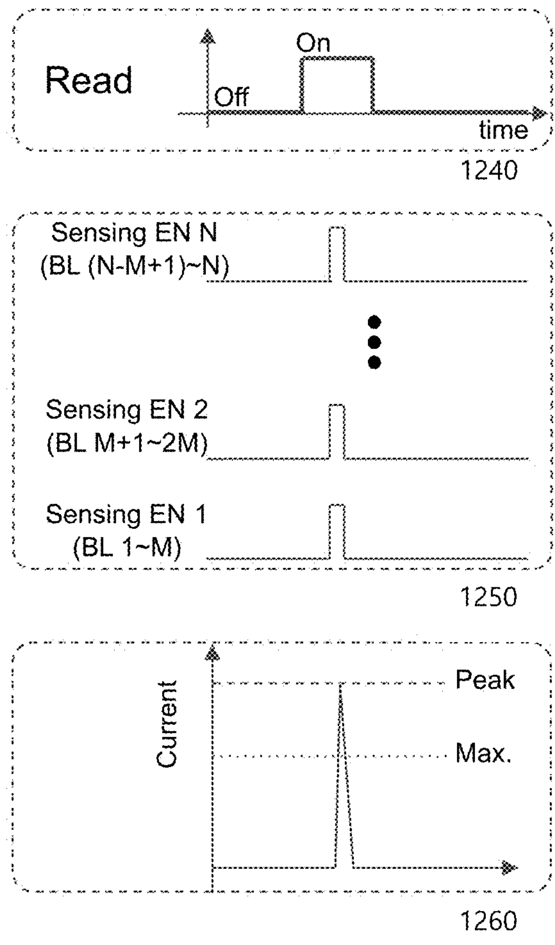
Figure 12C:
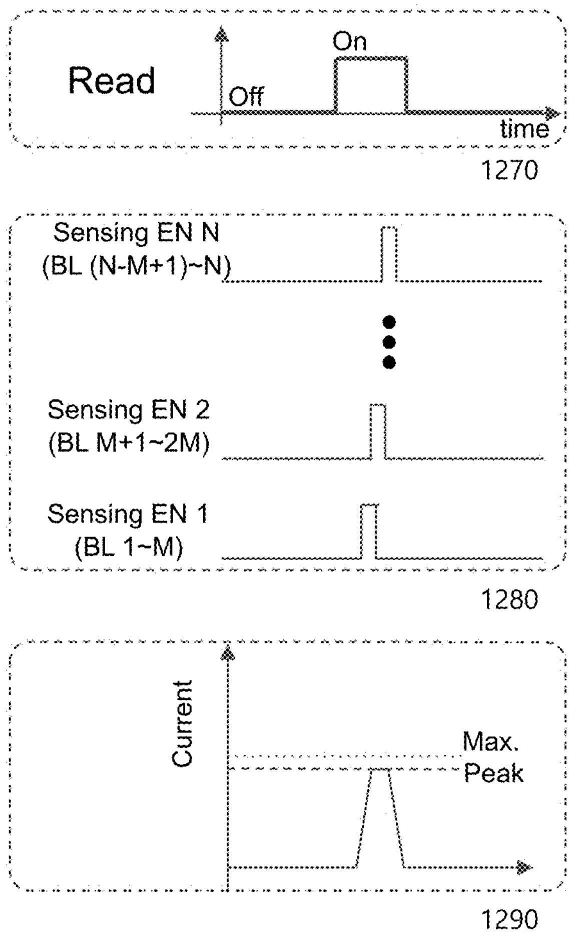

FIGS. 12A, 12B, and 12C show exemplary diagrams of the read (or verify) operation of a non-volatile memory device.

FIG. 12A illustrates an exemplary operation time, sensing EN pulses, and tolerable current levels of a nonvolatile memory device for a read operation when the sensing EN pulses from the controller are applied to the corresponding sensing circuits in sequence at sufficient intervals without overlapping.

A timing diagram 1210 shows read operation time for successive sensing EN pulses to sense the bit line (BL) of the nonvolatile memories. Sequential reading pulses with sufficient time intervals represents BL sensing operation to read the data of corresponding memory cells from the sensing circuits inside the column driver at each bit line. Multiple timing diagrams 1220 show successive enabling pulses from the controller to enable the operation of sensing circuits in the column driver. These enabling pulses correspond to the sensing circuit 1, sensing circuit 2, . . . , sensing circuit N, respectively. For instance, the memory array has M rows and N columns, and Sensing EN 1 pulse enables the sensing circuits coupled to the bit lines of the first column of the memory array (BL1~BL M) to read the corresponding memory cells. Further, sensing EN2 pulse enables sensing circuit 2 coupled to the bit lines of the second column of the memory array (BLM+1~BL2M) to read the corresponding memory cells. Those successive sensing enable pluses (Sensing EN1, EN2, . . . , EN N) enable sequential reading operations of the entire memory cells connected by bit lines (BL1, BL2, . . . , BL N).

A timing diagram 1230 illustrates a characteristic distribution of total current of the memory device when sensing EN signals are applied to the memory cells. By sequentially enabling the selected sensing circuits to sense the state of the selected memory cells, the column driver can control the peak current level of the memory device within a target level (max). However, it should be noted that the total READ time may be very long. In addition, performance can be poor due to the lack of high-speed operation.

FIG. 12B shows exemplary operation time, sensing EN pulses, and excessive current level of the memory device for the read operation when Sensing EN signals are applied simultaneously to corresponding sensing circuits inside the column driver. A top timing diagram 1240 shows the read operation time for simultaneous reading of all nonvolatile memories. Middle timing diagrams 1250 illustrate the timing diagram of Sensing EN signals. Those signals are simultaneously applied to all the sensing circuits. A bottom timing diagram 1260 illustrates a characteristic of a total current of the memory device when all the Sensing EN pulses are applied simultaneously. When simultaneously enabling all sensing circuits in the column driver to read the memory cells, the total current spike exceeds a tolerable current level (max). In other words, because all the sensing circuits are enabled at the same time, the read time becomes very short, but the peak current exceeds the Max limit value, and that may cause a power supply noise and increase the probability of an error in the read operation.

FIG. 12C shows exemplary operation time, sensing EN pulses, and ideal current level of the memory device for the read operation when Sensing EN pulses are applied to the sensing circuits according to one embodiment of the present invention. A top diagram 1270 shows a read operation time. This timing diagram has a predefined width equivalent to an amount of time during which sequential Sensing EN signals applied to sensing circuits overlap to some extent, according to one embodiment of the present invention. This read operation time is longer than that of FIG. 12B but shorter than the read operation time in FIG. 11A. Middle timing diagrams 1280 illustrate consequential enabling pulses from the controller to enable the operation of sensing circuits in series. For instance, a first sensing enabling pulse, a second sensing enabling pulse, . . . , and a Nth sensing enabling pulse overlap to some extent during the read operation time to corresponding sensing circuits.

A bottom diagram 1290 illustrates a characteristic of a total current of the memory device when the overlapped Sensing EN pulses are applied to the sensing circuits. As a result, the magnitude of a total current does not exceed a tolerable current level (max), while the width of the read operation time is longer than that in FIG. 11B. Since each Sensing EN signal is applied after a delay to each sensing circuit, the number of enabled sensing circuits at any moment is adjusted to prevent the peak current of the memory device from exceeding the maximum value. This can prevent a power supply noise and errors in the erase operation, and the erase operation time can be greatly reduced compared to FIG. 12A.

Figure 13A:
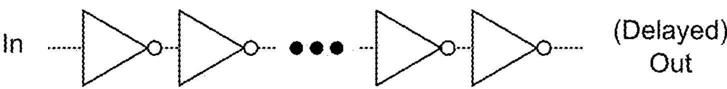
FIGS. 13A, 13B, and 13C show exemplary short delay circuits embodied in the non-volatile memory device according to the present invention.
Figure 13B:
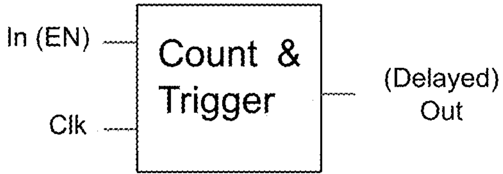
Figure 13C:
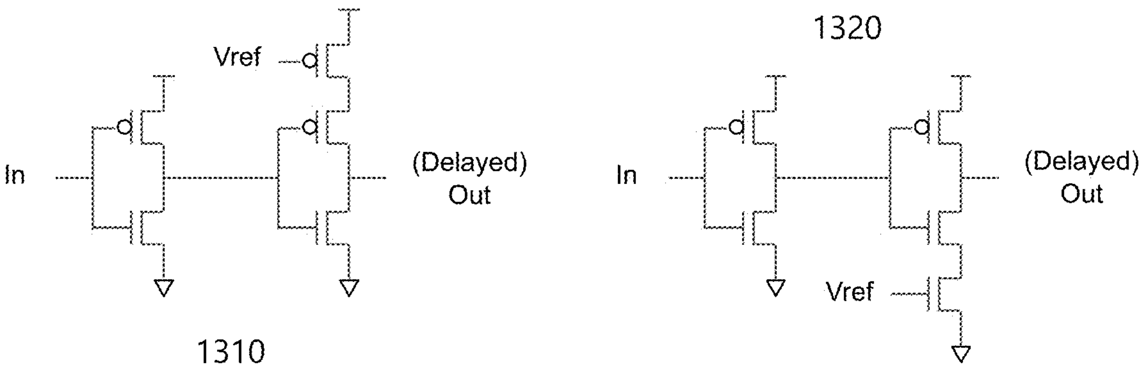

FIGS. 13A, 13B, and 13C show examples of delay circuits that can generate controlled delays according to embodiments of the present invention. Those delay circuits can be used to implement the delay blocks that are located inside or outside the controller, as shown in FIGS. 3, 4, 7, 8, and 10.

The first example is an inverter chain shown in FIG. 13A. An inverter chain is configured with a connection of consecutive inverters. Each output of inverters is coupled to the input of the next inverter. An inverter chain uses the propagation delay of an inverter for the delay time, where the delay time is controlled by the length and width of inverter transistors and the number of inverters.

FIG. 13B illustrates another delay circuit example using a clock counter. The delay circuit of FIG. 13B has two inputs, In (EN) and Clk, one output, Out, and a clock counter inside the delay circuit (not shown). The clock counter can sense and count the clock through the Clk input, and after a predetermined number of the clock, the input signal (In (EN)) can be delivered to the output (Out). Thus, the delay time is controlled by the predetermined number of the clock.

FIG. 13C shows another exemplary delay circuit, which is an inverter chain with a reference voltage. In FIG. 13C, an inverter chain can be combined with an analog reference voltage (Vref) which are used to control the delay time. Two inverters are chained and one PMOS or one NMOS is combined with the second inverter to adopt an analog reference voltage (Vref). The input signal of the first inverter is coupled to the gate of PMOS and NMOS of the first inverter. The source of PMOS of the first inverter is connected to VDD, and the drain of PMOS is coupled to the drain of NMOS of the first inverter. The source of NMOS of the first inverter is grounded. The drain of PMOS and NMOS of the first inverter is the output of the first inverter that is coupled to the input of the next inverter.

The time delay circuit 1310 shows the second inverter in which the Vref line is connected to the gate of PMOS in the second inverter, and the drain of one PMOS is connected to the source of the other PMOS in series as one embodiment of the present invention. The time delay circuit 1320 shows the second inverter in which the Vref is connected to the gate of NMOS, the source of that NMOS is connected to GND and the drain of that NMOS is coupled to the source of the NMOS. Regardless the differences of theses second inverters, the input signal can be delivered only when the proper analog reference voltage (Vref) is received to operate the second inverter of the delay circuit. Thus, the delay time can be controlled by the analog reference voltage (Vref).

Figure 14:
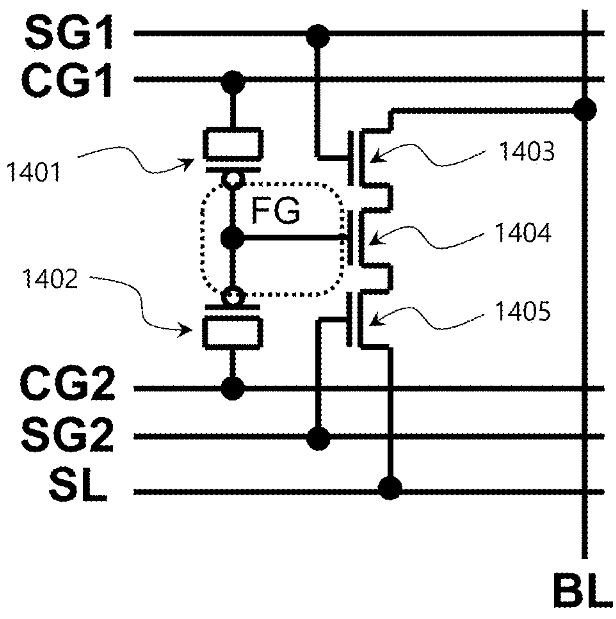
FIG. 14 shows an exemplary memory cell circuit in the non-volatile memory device according to the present invention.

FIG. 14 shows a schematic diagram of one exemplary nonvolatile memory cell according to the present invention. Even if not depicted specifically, each row of the non-volatile memory cells in the memory cell array may share a reference voltage line, SL, and a signal high voltage line, WL, where each SL may provide reference voltage inputs to the non-volatile memory in the corresponding row and each WL delivers HV from the HV switch inside the row driver to the corresponding row. Each WL may provide high voltage inputs to CG1 and CG2 of the non-volatile memories in the corresponding row, so the non-volatile memories in a row may receive substantially the same high voltage input and reference voltage input. The memory cell array has M rows and N columns. Each memory cell of the memory cell array has its own BL and each sensing circuit inside the column driver receives M numbers of BL. For example, the sensing circuit 1 receives BL 1~BL M from the first column of the memory cell array, the sensing circuit 2 receives BL M+1~BL 2M from the second column of the array, and the sensing circuit N receives BL N−M+1~BL N from the Nth column of the array.

Each memory cell may include a coupling transistor 1401, a write transistor 1402, an upper (or first) select transistor 1403, a read transistor 1404, and a lower select transistor 1405. The proposed row driver generates various row signals, SG1, SG2, CG1, CG2, and SL, to each memory cell through corresponding row signal lines. The single-poly embedded flash memory may be used as the resistive changing element, and the conductance of the read transistors that are electrically coupled to the floating gate (FG) of the flash may serve as the resistive changing element. The conductance of the read transistors may be determined by the threshold voltage VTH of their respective FG nodes. The VTH of the FG nodes may be first coarsely programmed using a balanced step pulse programming method, then subsequent constant pulse programming steps with reduced voltages can fine tune the VTH value to accurately program the weight value to be stored in the memory cell. The coupling transistor (upside) directly connected to CG1 may be upsized for higher coupling of the floating gate node (FG) to the control signal provided through CG1. The coupling transistor directly coupled to CG1 may be larger than a write transistor (downside) connected to CG2. With high program voltages driven to CG1 and CG2, the memory cell can be programmed by injecting electrons into FG.

For the erase operation, HV is applied to CG2 of a write transistor through WL from the HV switch, and other row signals, SG1, SG2, CG1, and SL, are coupled to ground, GND. During the erase operation, the negative charges, electrons, inside the FG are ejected outside of the FG through the gate of the write transistor, CG2, because of the high voltage. During the program/write operation, HV is applied to CG1 and CG2 through WL from the HV switch, and VDD is applied to SG1 and SL. SG2 is coupled to GND. Because of the HV of CG1 and CG2, the negative charges are trapped inside the FG. The trapped negative charges work as data of the memory cell and will change the threshold voltage VTH of the FG node during the read operation. For the read operation, a read voltage, Vrd, is applied to the CG1 and CG2, VDD is applied to SG1 and SG2, and SL is coupled to GND. The threshold voltage VTH of the FG node and the current of BL are changed depending on the amount of the negative charges inside the FG. Thus, during the read operation, the sensing circuit of the column driver senses the BLs of each memory cell of the corresponding column to check the data of each memory cell.

Figure 15:
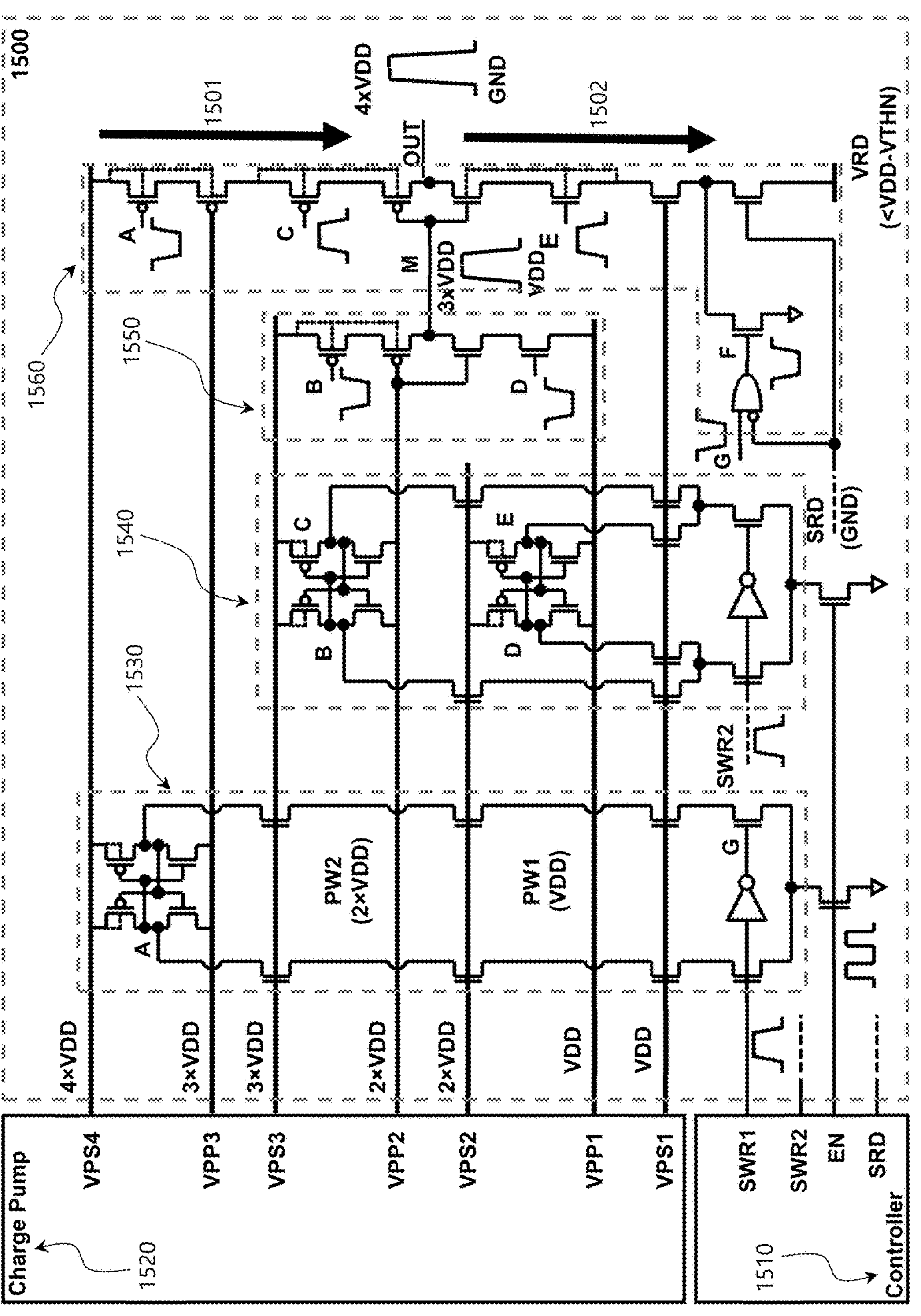
FIG. 15 shows a block diagram of high voltage switches embodied in the row driver in FIG. 3 according to one embodiment of the present invention.

FIG. 15 shows a high voltage switch circuit associated with the time delay circuit, which is an embodiment of the present invention. The high voltage switch (HV switch) 1500 is located inside the row driver 130 and connected to the proposed controller 1510 generating timing-controlled EN/SWR1/SWR2/SRD signals. HV switch 1500 comprises a first latch stage 1530, a second latch stage 1540, an M-node driver stage 1550, and an output driver stage 1560. The input signals to the HV switch 1500 are SWR1 coupled to the first latch 1530, SWR2 coupled to the second latch stage 1540, an EN (enable) signal coupled to both the first latch stage 1530 and second latch stage 1540, and an SRD signal coupled to the output driver stage 1560. The output signal from the OUT node is used as a word line WL to a row of memory cells.

The first latch stage 1530 includes a latch circuit electrically coupled between the VPS4 and VPP3 supply lines. The latch circuit is coupled to the A node of the output driver stage 1560. The second latch stage 1540 is further comprised of two latches electrically coupled between the VPS3 and VPP2 lines and the VPS2 and VPP1 lines respectively. The latch between VPS3 and VPP2 is coupled to the B node of the M-node driver 1550, and the C node of the output driver stage 1560. The latch between VPS2 and VPP1 is coupled to the D node of the M-node driver 1550 and the E node of the output driver stage 1560. The M-node driver 1550 is further comprised of B and D nodes and coupled to VPP1, VPP2 and VPS3 supply lines, and an M node is coupled to the input of the output driver stage 1560. The B node is comprised of PMOS transistors, and the D node is comprised of NMOS transistors.

The output driver stage 1560 is further comprised of transistors of which the gates are coupled to the A node, VPP3, C node, M node, E node, VPS1 and SRD. The transistors with gates coupled to the A node, VPP3, C node and M node are PMOS transistors, and the PMOS transistors are coupled in a series between the VPS4 supply line and the OUT node. The OUT node is then coupled to the NMOS transistors in a series with the gates connected M node, E node, VPS1 and SRD. The source of the last NMOS of the series connection is coupled to VRD. An inverted SWR1 signal is provided from the first latch stage to the output driver stage 1560 at node G.

The output voltage, OUT, can be switched to a high voltage, 4×VDD, for program/erase operations of the memory cell connected to the OUT node. The VPS1 through VPS4 supply lines are boosted to 1×VDD, 2×VDD, 3×VDD, and 4×VDD voltage levels from the Charge pump 1520. The VPP1 through VPP3 supply lines are also boosted to 1×VDD, 2×VDD, 3×VDD levels from the Charge pump 1520 as shown. The controller provides timing controlled EN/SWR1/SWR2/SRD signals to suppress peak current to flip the signal levels of the nodes A, B, C, D, E. When SWR1 and SWR2 rise from GND to VDD, the nodes A, B, D, and F are discharged to 3×VDD, 2×VDD, VDD, and GND, respectively. The E and C nodes are pulled up to 2×VDD and 3×VDD, respectively. This pulls up M to 3×VDD and OUT to 4×VDD. When the opposite transitions on SWR1 and SWR2 occur, the opposite transitions occur and M and OUT are pulled down to VDD and GND levels. The arrow 1501 depicts the path in the output for charging the OUT node up to 4×VDD, and the arrow 1502 depicts the path in the output for discharging the OUT node back to GND. In this manner the row driver can turn on and off the high voltage switch to deliver high voltage to the memory cell array for program and erase operation.

Figure 16:
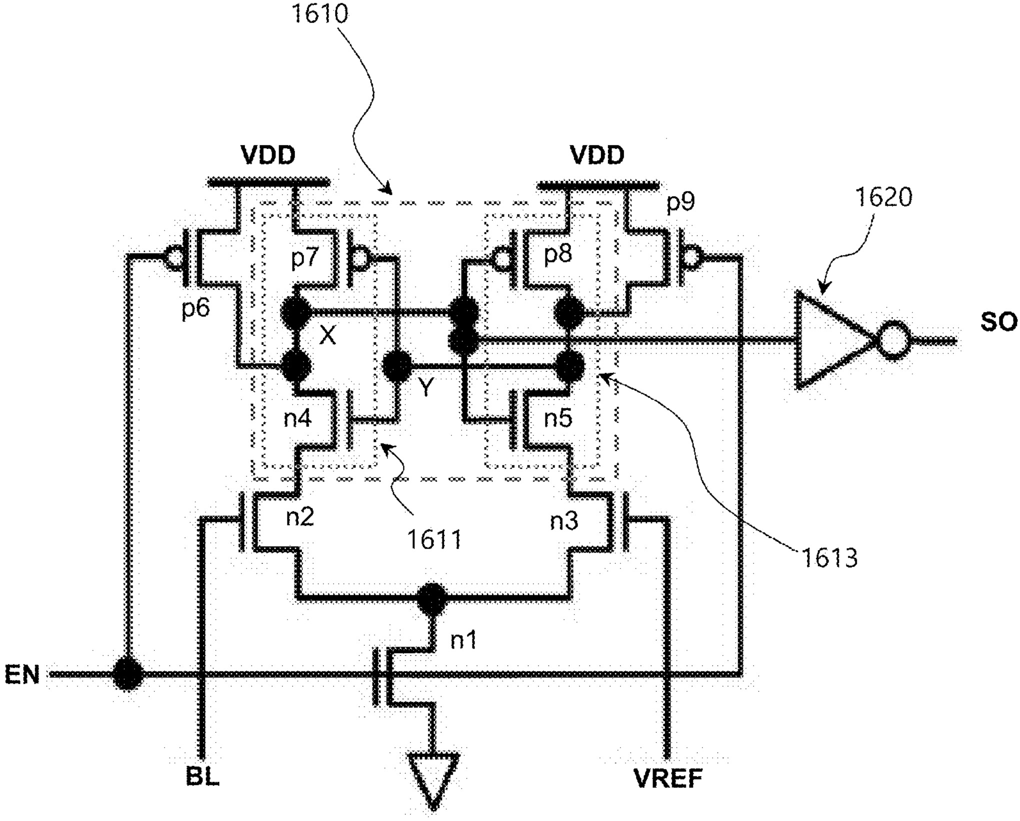
FIG. 16 shows a block diagram of a sensing circuit embodied in the column driver in FIG. 7 according to one embodiment of the present invention.

FIG. 16 shows a sensing circuit inside the column driver to detect BL signal level by comparing it with VREF signal. The sensing circuit include (1) a latch circuit 1610 using a MOS (Metal Oxide Semiconductor) Field Effect Transistor (FET) as an example of a latch circuit, (2) two enabling p-type MOSFET p6 and p9, (3) two input n-type MOSFET n2 and n3 having gates coupled to BL and VREF, respectively, and (4) one enabling N-type MOSFET n1.

The latch circuit includes the CMOS inverter 1611 (the first inverter circuit) and the CMOS inverter 1613 (the second inverter circuit). In the CMOS inverter 1611, PMOS p7 has a source coupled to a power supply source VDD whereas NMOS n4 has a source connected to the drain of n2. PMOS p7 and NMOS n4 have gates commonly coupled to a node Y, and drains commonly coupled to a node X. The inverter 1620 swaps the node X signal to sensing output, SO. In the CMOS inverter 1613, PMOS p8 has a source coupled to a power supply source VDD whereas NMOS n5 has a source connected to the drain of n3. PMOS p8 and NMOS n5 have gates commonly coupled to a node X, and drains commonly coupled to a node Y.

The p-type MOSFET p6 has a gate coupled to EN line, a source coupled to VDD, and a drain coupled to the node X that is coupled to the inverter 1620, enabling the inverter 1620 converts the node X signal to the voltage level corresponding to a logical 0 or 1, as sensing output signal SO. The p-type MOSFET p9 has a gate coupled to EN line, a source coupled to VDD, and a drain coupled to the node Y that is coupled to the gates of the p-type MOSFET p7 and n-type MOSFET n4.

The n-type MOSFET n2 has a gate coupled to BL line, a drain connected to a source of n-type MOSFET n4 embodied in the inverter 1611, and a source connected to a drain of the NMOS transistors n1. The n-type MOSFET n3 has a gate coupled to VREF line, a drain connected to a source of n-type MOSFET n5 embodied in the inverter 1613, and a source connected to the drain of the NMOS transistors n1.

The one enabling N-type MOSFET n1 has a gate connected to the EN line, a drain coupled to the sources of the n-type MOSFET n2 and n3, and source coupled to a ground level.

The operation of the sensing circuit inside the column driver is as follows. The sensing circuit receives an EN signal from the proposed controller to activate and generate SO signal. At a moment when EN changes from low to high level, BL and VREF signal levels are compared. When BL signal is higher than VREF, SO signal switches to high level, and when BL signal is lower than VREF, SO signal switches to the low level. The transition of the signal level of internal nodes can result in electric current flow from VDD and VSS, which can result in fluctuation of VDD/VSS levels due to the parasitic resistive element connected to the power supply. This can create unwanted power supply noise during read operation when the peak current level of the array exceeds the maximum allowable level.

What is claimed is:

1. A non-volatile memory device comprising: an array of non-volatile memory cells;

a controller in communication with the non-volatile memory cell, a row driver including a plurality of high-voltage switches for applying high-voltages to non-volatile memory cells;

a column driver including a plurality of sensing circuits for monitoring the data of the non-volatile memory cells; and, a plurality of time delay circuits, wherein the time delay circuit is configured to reduce peak current caused by simultaneous application of high voltages to the non-volatile memory cells or simultaneous detection of current flowing across bit lines of the non-volatile memory cells, wherein the sensing circuit comprises a pair of cross connected CMOS inverters in that an output node of a first CMOS inverter is coupled to an input node of a second CMOS inverter, wherein a PMOS circuit within the first CMOS inverter is connected to a first enable PMOS circuit in parallel and a PMOS circuit within the second CMOS inverter is connected to a second enable PMOS circuit in parallel;

wherein (1) a NMOS circuit within the first CMOS inverter is connected to a first input NMOS circuit in series, a gate terminal of the first input NMOS circuit is connected to bit line and (2) a NMOS circuit within the second CMOS inverter is connected to a second input NMOS circuit in series, a gate terminal of the second input NMOS circuit is connected to a voltage reference line; and wherein the first and second input NMOS circuits are connected to a third NMOS circuit and a drain terminal of the third NMOS circuit is shared by the first and second input NMOS circuits.

2. The non-volatile memory device of claim 1, wherein the non-volatile memory device further includes a charge pump circuit for pumping up a plurality of voltages from a predefined reference voltage, said charge pump circuit connected to the plurality of high voltage switches and the controller.

3. The non-volatile memory device of claim 2, wherein the high voltage switch transmits an input signal to the non-volatile memory cell when activated by the controller, wherein said input signal can vary from the predefined reference voltage, two times the reference voltage, three times the reference voltage, and four times the reference voltage to the non-volatile memory cell.

4. The non-volatile memory device of claim 1, wherein an enable line connecting the controller and the sensing circuit is configured to connect gate terminals of the first and second enable PMOS circuits and a gate terminal of the third NMOS circuit.

5. The non-volatile memory device of claim 1, wherein the row driver includes the time delay circuits connected in series, each time delay circuit arranged between all or some of the pairs of high-voltage (HV) switches.

6. The non-volatile memory device of claim 1, wherein the row driver includes the time delay circuits connected in series, each said time delay circuits arranged between all or some of groups including a plurality of the HV switches.

7. The non-volatile memory device of claim 1, wherein the controller includes:

a plurality of enable lines coupling the controller to each group with a plurality of the HV switches within the row driver, and a plurality of time delay circuits connected in series with an identical delay value arranged between each of the enable lines such that a plurality of enable signals are sequentially sent to the groups of HV switches coupled through the enable lines, respectively.

8. The non-volatile memory device of claim 1, wherein the column driver includes the time delay circuits connected in series, each said time delay circuit arranged between each pair of the sensing circuits.

9. The non-volatile memory device of claim 1, wherein the delay circuits within the column driver are connected in series, each said delay circuits arranged between each group including a plurality of the sensing circuits.

10. The non-volatile memory device of claim 1, wherein the controller includes:

a plurality of enable lines coupling the controller to each group with a plurality of the sensing circuits within the column driver, and a plurality of time delay circuits connected in series with an identical delay value arranged between each of said enable lines such that a plurality of enable signals are sequentially sent to the groups of HV switches coupled through the enable lines, respectively.

11. The non-volatile memory device of claim 1, wherein the time delay circuit is configured with a plurality of a pair of inverters connected in series.

12. The non-volatile memory device of claim 1, the non-volatile memory cell includes:

a pair of PMOS transistors configured to share a floating gate;

a stack of three NMOS transistors, a middle of said NMOS transistor has a gate extended to the floating gate;

a plurality of word lines connected to the pair of PMOS transistors for program, write, or erase data stored in the floating gate;

a pair of lines for enabling activation of the NMOS transistors;

a bit line connected to one end of the stack of three NMOS transistors; and a sensing line connected to the other end of the stack of three NMOS transistors for sensing currents flow via a bit line.

13. The non-volatile memory device of claim 2, the high voltage switch is connected to a charge pump circuit, said high voltage circuit is configured to transmit an input signal to the connected non-volatile memory cell, transmit the predefined reference voltage, two times the reference voltage, three times the reference voltage, and four times the reference voltage to the non-volatile memory cell when activated by the controller.

* * * * *